(12) United States Patent
Hsieh

(10) Patent No.: US 7,638,400 B2
(45) Date of Patent: Dec. 29, 2009

(54) METHOD FOR FABRICATING SEMICONDUCTOR DEVICE

(75) Inventor: Ping-Pang Hsieh, Shanhua Township, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 396 days.

(21) Appl. No.: 11/608,927

(22) Filed: Dec. 11, 2006

(65) Prior Publication Data

US 2007/0099387 A1    May 3, 2007

Related U.S. Application Data

(60) Continuation-in-part of application No. 11/078,543, filed on Mar. 11, 2005, now Pat. No. 7,157,343, which is a division of application No. 10/820,601, filed on Apr. 7, 2004, now Pat. No. 7,126,189.

(51) Int. Cl.
*H01L 21/336* (2006.01)
(52) U.S. Cl. ............... 438/301; 438/303; 257/E21.437
(58) Field of Classification Search ............... 438/301, 438/303; 257/E21.437
See application file for complete search history.

(56) References Cited

U.S. PATENT DOCUMENTS

| 5,734,185 | A  | * | 3/1998  | Iguchi et al. ............ 257/336 |
| 6,362,062 | B1 | * | 3/2002  | Nandakumar ........... 438/303 |
| 6,380,053 | B1 | * | 4/2002  | Komatsu ................. 438/517 |
| 6,448,140 | B1 | * | 9/2002  | Liaw ....................... 438/279 |
| 6,468,915 | B1 | * | 10/2002 | Liu ......................... 438/706 |
| 2001/0016362 | A1 | * | 8/2001  | Brooks et al. ............. 438/4 |
| 2003/0214000 | A1 | * | 11/2003 | Jang et al. ................ 257/384 |
| 2005/0079655 | A1 | * | 4/2005  | Chen et al. .............. 438/140 |
| 2005/0215055 | A1 | * | 9/2005  | Bu et al. .................. 438/682 |
| 2005/0227446 | A1 | * | 10/2005 | Kao et al. ................ 438/305 |

* cited by examiner

*Primary Examiner*—Charles D Garber
*Assistant Examiner*—Stanetta D Isaac
(74) *Attorney, Agent, or Firm*—J.C. Patents

(57) ABSTRACT

A method for forming a uniform doped region in a substrate having a non-uniform material layer thereon is provided. The non-uniform material layer is removed form the substrate. Thereafter, a treatment process is performed to form an offset material layer on a predetermined doped region of the substrate. Next, an ion implantation process is performed to form the uniform doped region in the predetermined doped region below the offset material layer.

23 Claims, 20 Drawing Sheets

METHOD FOR FABRICATING SEMICONDUCTOR DEVICE

CROSS-REFERENCE TO RELATED APPLICATION

This application is a continuation-in-part of a prior application Ser. No. 11/078,543 filed on Mar. 11, 2005, and the latter application Ser. No. 11/078,543 is a divisional of another application Ser. No. 10/820,601 filed on Apr. 7, 2004 whose U.S. Pat. No. is 7,126,189 issued on Jun. 27, 2006. All disclosures of the U.S. applications are incorporated herein by reference.

BACKGROUND OF THE INVENTION

1. Field of the Invention

This invention generally relates to a method for fabricating a semiconductor device, and more particularly to a method for fabricating a semiconductor device to enhance the uniformity of the semiconductor device.

2. Description of Related Art

As the line width and the size of the semiconductor device become smaller, it is unavoidable that the polysilicon electrode of the MOSFET and the memory device become smaller. When the integration of the devices increases, the resistance of the source region and the drain region usually increases. However, as the size of the device shrinks and its process margin declines, the uniformity of the semiconductor devices becomes worse.

During the fabrication of the MOSFET, after the gate electrode is formed by patterning a polysilicon layer on a gate dielectric layer, the ion implantation is performed to form the source/drain extension region at the two sides of the gate electrode using the gate dielectric layer to protect the surface of the substrate. Thereafter, a composite silicon oxide/silicon nitride spacer is formed on the sidewalls of the gate after defining the gate electrode. The composite spacer can be formed by forming an offset spacer oxide layer covering the substrate and the gate electrode, forming a spacer silicon nitride layer covering the offset spacer oxide layer and then performing anisotropic etching to remove a portion of spacer silicon nitride layer until the offset spacer oxide layer is exposed. The remaining offset spacer oxide layer can protect the surface of the substrate when performing the ion implantation step to the substrate. Later on, the ion implantation is performed to form the source and drain regions at the two sides of the gate electrode and then the salicide process is performed.

However, when the size of the device and the line-width shrink, the thickness of each layer and the process margin in each layer also become smaller. Especially, when the thickness of the gate dielectric and the offset spacer oxide layer is less than or about 100 Å, the thin offset spacer oxide layer and the gate dielectric layer can easily be overetched and the thickness of the remaining gate dielectric layer and that of the remaining offset oxide layer are not uniform within the wafer. Since the thickness of the gate dielectric layer and the remaining offset spacer oxide layer is varied, the junction depths of the source/drain extension region and that of the source/drain contact region become non-uniform after the ion implantation step through the non-uniform gate dielectric layer and the non-uniform offset spacer oxide layer respectively. In addition to the non-uniform depth of the source/drain extension region and that of the source/drain contact region, the effective channel length of the gate electrode may be changed, which significantly affects the uniformity of the semiconductor devices on the wafer.

SUMMARY OF THE INVENTION

The present invention is to provide a method for fabricating semiconductor device in order to enhance the uniformity of the semiconductor devices.

The present invention provides a method for fabricating a semiconductor device. A gate dielectric layer and a gate conductive layer are formed on a substrate. The gate conductive layer is patterned. A first oxidation process is performing to form an offset oxide layer in the substrate not covering by the gate electrode. A source/drain extension region is formed in the substrate below the first offset oxide layer. A spacer is formed on a sidewall of the gate electrode. A source/drain contact region is formed in the substrate at two sides of the gate electrode and the spacer.

In the method of fabricating a method for fabricating a semiconductor device according to an embodiment of the present invention, the method further comprises a step of removing a portion of the gate dielectric layer.

In the method of fabricating a method for fabricating a semiconductor device, the step of removing the portion of the gate dielectric layer is performed using the gate electrode as mask after the step of forming the source/drain extension region and before the step of forming the spacer.

In the method of fabricating a method for fabricating a semiconductor device according to an embodiment of the present invention, the method further comprises a step of performing a second oxidation process to form a second offset oxide layer before the step of forming the source/drain contact region.

In the method of fabricating a method for fabricating a semiconductor device according to an embodiment of the present invention, the method further comprises a step of removing the first offset oxide layer before the step of forming the spacer.

In the method of fabricating a method for fabricating a semiconductor device according to an embodiment of the present invention, the second oxidation process comprises an oxygen plasma treatment process, a thermal oxidation process or a RTA oxidation process.

In the method of fabricating a method for fabricating a semiconductor device according to an embodiment of the present invention, the step of removing the gate dielectric layer is performed using the gate electrode and the spacer as a mask before the step of forming the source/drain contact region and after the step of forming the spacer.

In the method of fabricating a method for fabricating a semiconductor device according to an embodiment of the present invention, the method further comprises a step of performing a second oxidation process to form a second offset oxide layer before the step of forming the source/drain contact region.

In the method of fabricating a method for fabricating a semiconductor device according to an embodiment of the present invention, the method further comprises a step of removing the first offset oxide layer after of the step forming the spacer and before the step of performing the second oxidation process.

In the method of fabricating a method for fabricating a semiconductor device according to an embodiment of the present invention, the second oxidation process comprises an oxygen plasma treatment process, a thermal oxidation process or a RTA oxidation process.

In the method of fabricating a method for fabricating a semiconductor device according to an embodiment of the present invention, the step of removing the gate dielectric layer is performed before the step of performing the first oxidation process and the step of patterning the gate conductive layer.

In the method of fabricating a method for fabricating a semiconductor device according to an embodiment of the present invention, the method further comprises a step of performing a second oxidation process to form a second offset oxide layer before the step of forming the source/drain contact region.

In the method of fabricating a method for fabricating a semiconductor device according to an embodiment of the present invention, the method further comprises a step of removing the first offset oxide layer before the step forming the spacer.

In the method of fabricating a method for fabricating a semiconductor device according to an embodiment of the present invention, the method further comprises a step of removing the first offset oxide layer after the step of forming the spacer and before the second oxidation process.

In the method of fabricating a method for fabricating a semiconductor device according to an embodiment of the present invention, the second oxidation process comprises an oxygen plasma treatment process, a thermal oxidation process or a RTA oxidation process.

In the method of fabricating a method for fabricating a semiconductor device according to an embodiment of the present invention, the method further comprises removing portion of the gate dielectric layer and the first offset oxide layer before the step of forming the source/drain contact region.

In the method of fabricating a method for fabricating a semiconductor according to an embodiment of the present invention, the first oxidation process comprises an oxygen plasma treatment process, a thermal oxidation process or a RTA oxidation process.

In the method of fabricating a method for fabricating a semiconductor device according to an embodiment of the present invention, the method further comprises a step of forming an offset spacer between the sidewall of the gate electrode and the spacer.

In the method of fabricating a method for fabricating a semiconductor device according to an embodiment of the present invention, a material of the offset spacer includes silicon oxide.

In the method of fabricating a method for fabricating a semiconductor device according to an embodiment of the present invention, a material of the spacer includes silicon nitride.

In the method of fabricating a method for fabricating a semiconductor device according to an embodiment of the present invention, a width of the offset spacer is not larger than a width of the spacer.

The present also provides a method for fabricating a semiconductor device. A gate structure is formed on a substrate, the gate structure including a gate dielectric layer on the substrate and a gate conductive layer on the gate dielectric layer. An offset spacer and a spacer are formed on a sidewall of the gate structure. An oxidation process is performed to form an offset oxide layer on a surface exposed by the gate structure, the offset spacer and the spacer. A source/drain contact region is formed below the offset oxide layer on the substrate at two sides of the gate structure.

In the method of fabricating a method for fabricating a semiconductor device according to an embodiment of the present invention, the method further comprises a step forming a source/drain extension region in the substrate at two sides of the gate structure before the step of forming the offset spacer and the spacer, In the method of fabricating a method for fabricating a semiconductor device according to an embodiment of the present invention, the oxidation process comprises an oxygen plasma treatment process, In the method of fabricating a method for fabricating a semiconductor device according to an embodiment of the present invention, a material of the offset spacer includes silicon oxide.

In the method of fabricating a method for fabricating a semiconductor device according to an embodiment of the present invention, a material of the spacer includes silicon nitride.

In the method of fabricating a method for fabricating a semiconductor device according to an embodiment of the present invention, a width of the offset spacer is not larger than a width of the spacer.

The present invention still provides a method for forming a uniform doped region in a substrate having a non-uniform material layer thereon. A treatment process is performed to form an offset material layer on a predetermined doped region of the substrate. An ion implantation process is conducted to form the uniform doped region below the offset material layer on the predetermined doped region. The non-uniform material layer is removed.

In the method of fabricating a method for forming a uniform doped region in a substrate having a non-uniform material layer thereon according to an embodiment of the present invention, the step of treatment process comprises an oxidation process, and the offset material layer includes an offset oxide layer.

In the method of fabricating a method for forming a uniform doped region in a substrate having a non-uniform material layer thereon according to an embodiment of the present invention, the oxidation process comprises an oxygen plasma treatment process, a thermal oxidation process or a RTA oxidation process.

In the method of fabricating a method for forming a uniform doped region in a substrate having a non-uniform material layer thereon according to an embodiment of the present invention, the step of removing the non-uniform material layer is preformed before the step of performing the treatment process.

In the method of fabricating a method for forming a uniform doped region in a substrate having a non-uniform material layer thereon according to an embodiment of the present invention, the uniform doped region is a source/drain extension region.

In the method of fabricating a method for forming a uniform doped region in a substrate having a non-uniform material layer thereon according to an embodiment of the present invention, the uniform doped region is a source/drain contact region.

In the method of fabricating a method for forming a uniform doped region in a substrate having a non-uniform material layer thereon according to an embodiment of the present invention, the step of removing the non-uniform material layer is performed after the step of performing the ion implantation process.

In the method of fabricating a method for forming a uniform doped region in a substrate having a non-uniform material layer thereon according to an embodiment of the present invention, the uniform doped region is a source/drain extension region or a source/drain contact region.

In the method of fabricating a method for forming a uniform doped region in a substrate having a non-uniform material layer thereon according to an embodiment of the present invention, the non-uniform material layer includes a silicon oxide layer.

The present invention provides a semiconductor device. A gate structure is located on a substrate, wherein the gate structure includes a gate dielectric layer on the substrate and a gate electrode on the gate dielectric layer. A spacer is located on the sidewall of the gate structure. A source/drain extension region is located in the substrate below the spacer. A first offset material layer is located on the source/drain extension region besides the gate structure and under the spacer, wherein the first offset material layer has a bottom surface below a bottom surface of the gate dielectric layer. A source/drain contact region is located in the substrate besides the gate structure adjacent to the source/drain extension region.

In the semiconductor device according to an embodiment of the present invention, a material of the first offset material layer includes silicon oxide.

In the semiconductor device according to an embodiment of the present invention, the device further comprises a second offset material layer and the source/drain contact region in the substrate separated from the gate structure by the spacer.

In the semiconductor device according to an embodiment of the present invention, the second offset material layer has a bottom surface below a bottom surface of the gate dielectric layer.

In the semiconductor device according to an embodiment of the present invention, the second offset material layer has a bottom surface below a bottom surface of first offset material layer.

In the semiconductor device according to an embodiment of the present invention, the device further comprises an offset spacer between the sidewall of the gate structure and the spacer.

In the semiconductor device according to an embodiment of the present invention, the gate dielectric layer is only under the gate electrode.

In the semiconductor device according to an embodiment of the present invention, the gate dielectric layer is under the gate electrode and extending between the offset spacer and the first offset material layer.

In the semiconductor device according to an embodiment of the present invention, the gate dielectric layer is under the gate electrode and extending between the spacer and the first offset material layer.

The present also provides a semiconductor device. A gate structure is located on the substrate, wherein the gate structure includes a gate dielectric layer on the substrate and a gate electrode on the gate dielectric layer. A spacer is located on the sidewall of the gate structure. A source/drain extension region is located in the substrate below the spacer, and the source/drain extension region has a top surface below a bottom surface of the gate dielectric layer. A source/drain contact region is located in the substrate besides the gate structure adjacent to the source/drain extension region. An offset material layer is located on the source/drain contact region separated from the gate structure by the spacer, wherein the offset material layer has a bottom surface below a bottom surface of the gate dielectric layer.

In the semiconductor device according to an embodiment of the present invention, a material of the offset material layer includes silicon oxide.

In the semiconductor device according to an embodiment of the present invention, the device further comprises an offset spacer between the sidewall of the gate structure and the spacer.

In the semiconductor device according to an embodiment of the present invention, the gate dielectric layer is only under the gate electrode.

Because in the present invention an oxygen plasma treatment process is performed before performing the source/drain ion implantation step in order to form an uniform offset oxide layer on the substrate, the depth of the subsequently formed source/drain contact regions will be uniform, which provides a constant effective channel width.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1A:
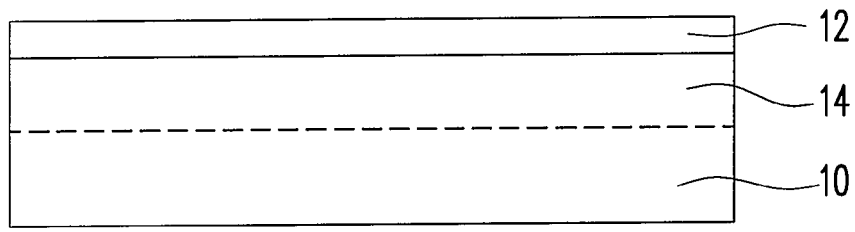
FIGS. 1A-1C show the cross-sectional view of the process for forming a uniform doped region in a substrate having a non-uniform material layer thereon in accordance with an embodiment of the present invention.
Figure 1B:
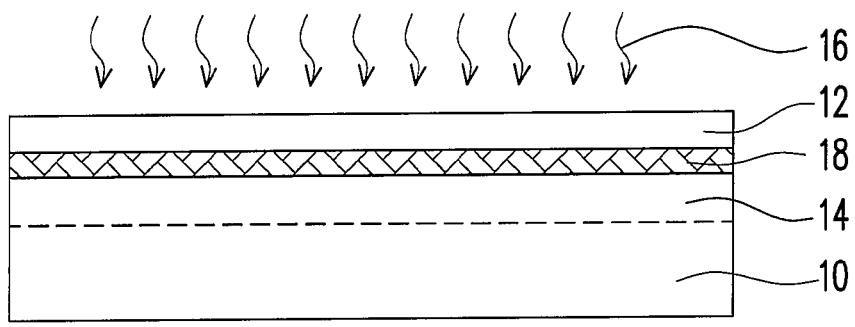
Figure 1C:
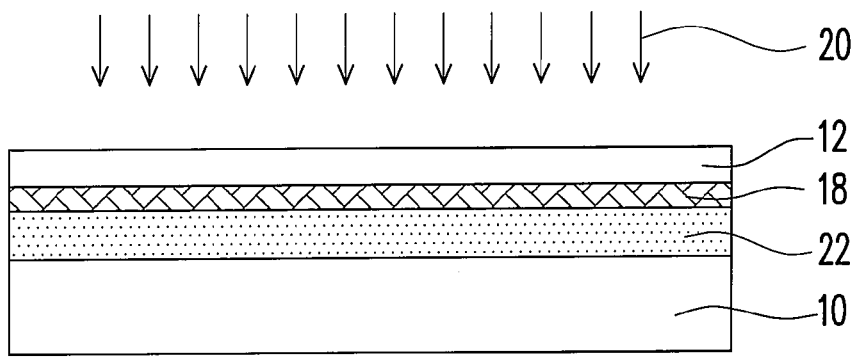

FIGS. 1A-1C show the cross-sectional view of the process for forming a uniform doped region in a substrate having a non-uniform material layer thereon in accordance with an embodiment of the present invention.

Referring to FIG. 1A, a substrate 10 such as a silicon substrate is provided. The substrate 10 has a non-uniform material layer 12 thereon and a predetermined doped region 14 therein. The non-uniform material layer 12 is a silicon oxide layer for serving as a gate dielectric layer or a spacer material layer, for example. The predetermined doped region 14 is a predetermined source/drain extension region or a predetermined source/drain contact region with p-type or n-type, for example.

The material layer 12 on the substrate 10 can protect the surface of the substrate 10 from damage due to the subsequent ion implantation, since the material layer 12 is non-uniform, the depth of the doped region becomes non-uniform after the ion implantation. To improve the uniformity of non-uniform doped region, a treatment process 16 is performed to form an uniform offset material layer 18 on the predetermined doped region 14 in the substrate 10. The treatment process 16 can be an oxidation process to form the offset material layer 18 made of oxide. When the predetermined doped region 14 is a predetermined source/drain extension region, the oxidation process can be an oxygen plasma treatment process, a thermal oxidation process or a rapid thermal annealing (RTA) oxidation process. When the predetermined doped region 14 is a predetermined source/drain contact region, the oxidation process can be an oxygen plasma treatment process, a thermal oxidation process or a RTA oxidation process. In an embodiment, the predetermined doped region 14 is a predetermined source/drain contact region, the oxidation process can be an oxygen plasma treatment process for considering thermal budget.

Referring to FIG. 1C, an ion implantation process 20 is performed to form a doped region 22 in the predetermined doped region 14 below the offset material layer 18. The doped region 22 is p-type or n-type source/drain extension region, or p-type or n-type source/drain contact region. The doped region 22 has a uniform depth within the wafer since the offset material layer 18 is formed. The non-uniform material layer 12 and the offset material layer 12 are then removed or maintained.

Figure 2A:
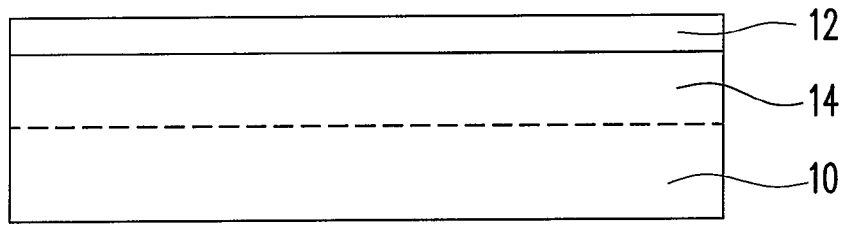
FIGS. 2A-2C show the cross-sectional view of the process for forming a uniform doped region in a substrate having a non-uniform material layer thereon in accordance with another embodiment of the present invention.
Figure 2B:
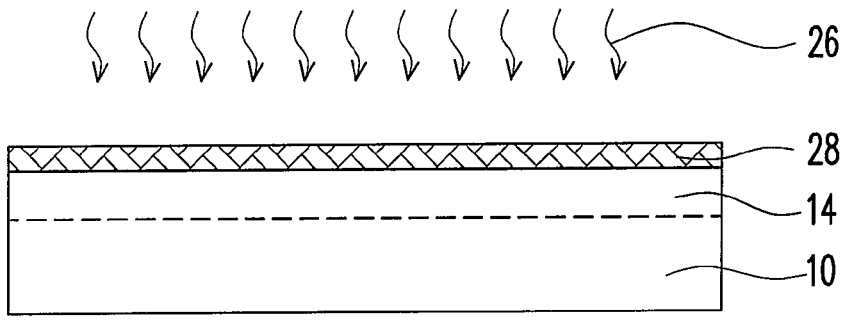
Figure 2C:
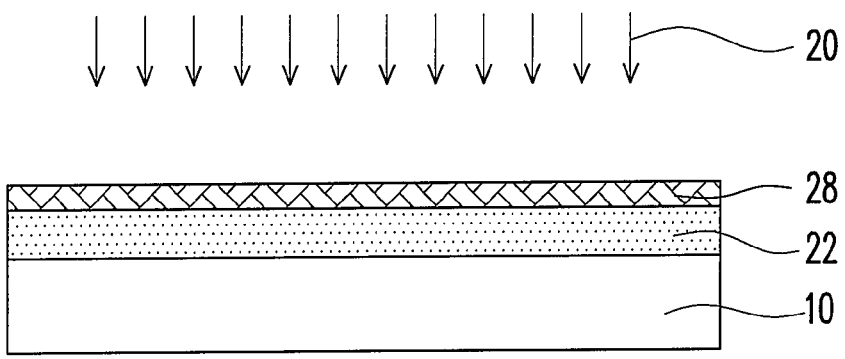

FIGS. 2A-2C show the cross-sectional view of the process for forming a uniform doped region in a substrate having a non-uniform material layer thereon in accordance with an embodiment of the present invention.

Referring to FIG. 2A, a substrate 10 such as a silicon substrate is provided. The substrate 10 has a non-uniform material layer 12 thereon and a predetermined doped region 14 therein. The non-uniform material layer 12 is a silicon oxide layer for serving as a gate dielectric layer or a spacer material layer, for example. The predetermined doped region 14 is a predetermined source/drain extension region or a predetermined source/drain contact region with p-type or n-type, for example. The material layer 12 on the substrate 10 can protect the surface of the substrate 10 from damage due to the subsequent ion implantation, since the material layer 12 is non-uniform, the depth of the doped region becomes non-uniform after the ion implantation.

Referring to FIG. 2B, in order to protect the surface of the substrate 10 from damage due to the subsequent ion implantation and forming uniform depth of doped region after the ion implantation, the non-uniform material layer 12 is first removed and then a treatment process 26 is performed to form an uniform offset material layer 28 on the predetermined doped region 14 in the substrate 10. The treatment process 26 can be an oxidation process to form the offset oxide layer 28. When the predetermined doped region 14 is a predetermined source/drain extension region, the oxidation process can be an oxygen plasma treatment process, a thermal oxidation process or a RTA oxidation process. When the predetermined doped region 14 is a predetermined source/drain contact region, the oxidation process can be an oxygen plasma treatment process, a thermal oxidation process or a RTA oxidation process. In an embodiment, the predetermined doped region 14 is a predetermined source/drain contact region, the oxidation process can be an oxygen plasma treatment process for considering thermal budget.

Referring to FIG. 2C, an ion implantation process 20 is performed to form a doped region 22 in the predetermined doped region 14 below the offset material layer 28. The doped region 22 is p-type or n-type source/drain extension region, or p-type or n-type source/drain contact region. The doped region 22 has a uniform depth within the wafer since the offset material layer 28 is formed. The offset material layer 28 can be removed selectively.

The First Embodiment

FIGS. 3A-3F show the cross-sectional view of the process for fabricating a semiconductor device in accordance with a embodiment of the present invention.

Figure 3A:
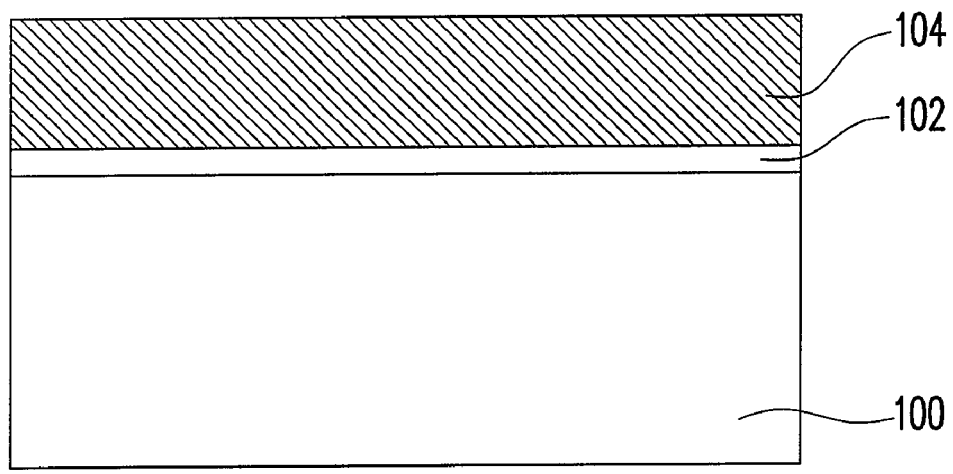
FIGS. 3A-3F show the cross-sectional view of the process for fabricating a semiconductor device in accordance with the first embodiment of the present invention.

Referring to FIG. 3A, a substrate 100 such as a silicon substrate is provided. The substrate 100 includes an isolation structure such as LOCOS or STI, and other semiconductor devices (not shown). A gate dielectric layer 102 such as silicon oxide layer is formed on the substrate 100. A gate conductive layer 104 is formed on the gate dielectric layer 102. The gate dielectric layer 102 is, for example, an oxide layer. The gate conductive layer 104 can be doped polysilicon formed by in-situ doping by CVD, for example.

Figure 3B:
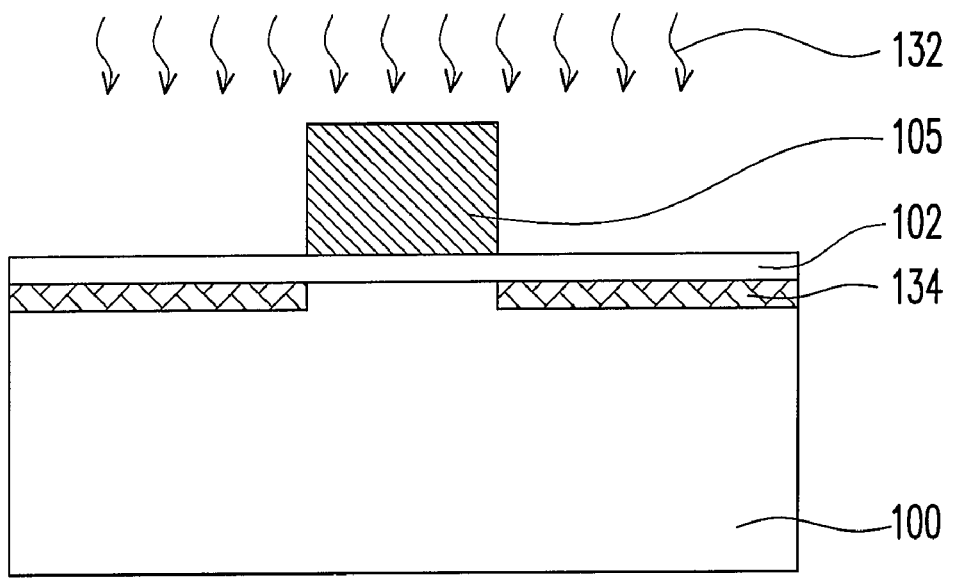

Referring to FIG. 3B, a gate electrode 105 is formed by defining the gate conductive layer 104 using photolithographic and etching technology with the gate dielectric layer 102 as a etching stop layer.

The gate dielectric layer 102 on the substrate can protect the surface of the substrate 100 from damage due to the subsequent ion implantation, if the gate dielectric layer is non-uniform at the source/drain extension region, the depth of the source/drain extension region becomes non-uniform after the ion implantation. Because the gate dielectric layer 102 is damaged during the etching process for forming the gate electrode 105, the thickness of the gate dielectric within wafer is non-uniform. To improve the uniformity of the subsequently formed source/drain extension region, an oxidation process 132 is performed. The oxidation process 132 can be an oxygen plasma treatment process, a thermal oxidation process or a RTA oxidation process. When the oxidation process 132 is performed by the oxygen plasma treatment process, a gas source including oxygen is flowed into the chamber to generate the plasma and the DC power of 100-2000 W is applied, for example. When oxidation process 132 is performed by thermal oxidation process, thermal oxidation process can be a dry thermal process using oxygen as a gas source, or a wet thermal process using $H_2O$ steam diluted with $N_2$. When oxidation process 132 is performed by the RTA process, a gas source including oxygen is flowed into the chamber. With the oxidation process 132, oxygen atoms are implanted to the surface of the substrate 100, especially the substrate 100 predetermined for forming source/drain extension region, and reacted with the substrate 100 to form silicon oxide. That is, a thin oxide layer will be formed below the gate dielectric layer 102 so that an offset oxide layer 134 with a uniform thickness is formed. The applied DC power, the implantation dosage and the treatment time can be adjusted based on the required thickness of the offset oxide layer.

The oxygen atoms will also react with the exposed surface of gate electrode 105. If the material of the gate electrode 105 is polysilicon, the implanted oxygen atoms will react with the polysilicon to form silicon oxide so that an oxide layer (not shown) on the gate electrode 105 will be formed. However, because the depth of the implanted oxygen atoms is not too deep, it will not consume too much silicon in the polysilicon layer and the performance of the gate structure will not be seriously affected.

Figure 3C:
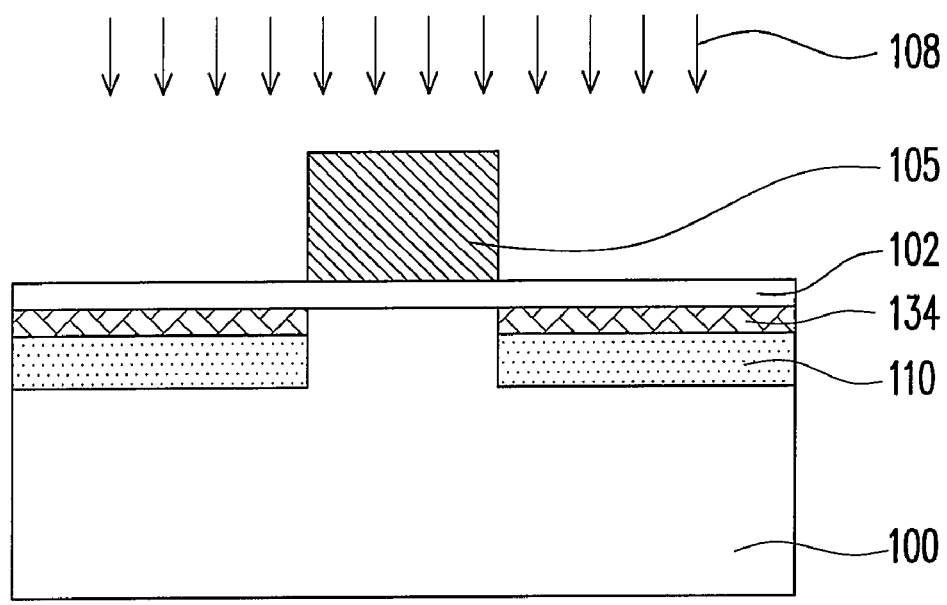

Referring to FIG. 3C, an ion implantation process 108 is performed by using the gate electrode 105 as a mask to form the source/drain extension region 110 in the substrate 100 at the two sides of the gate structure 106. Since the offset oxide layer 134 has a uniform thickness, the depth of source/drain region 110 is uniform.

Figure 3D:
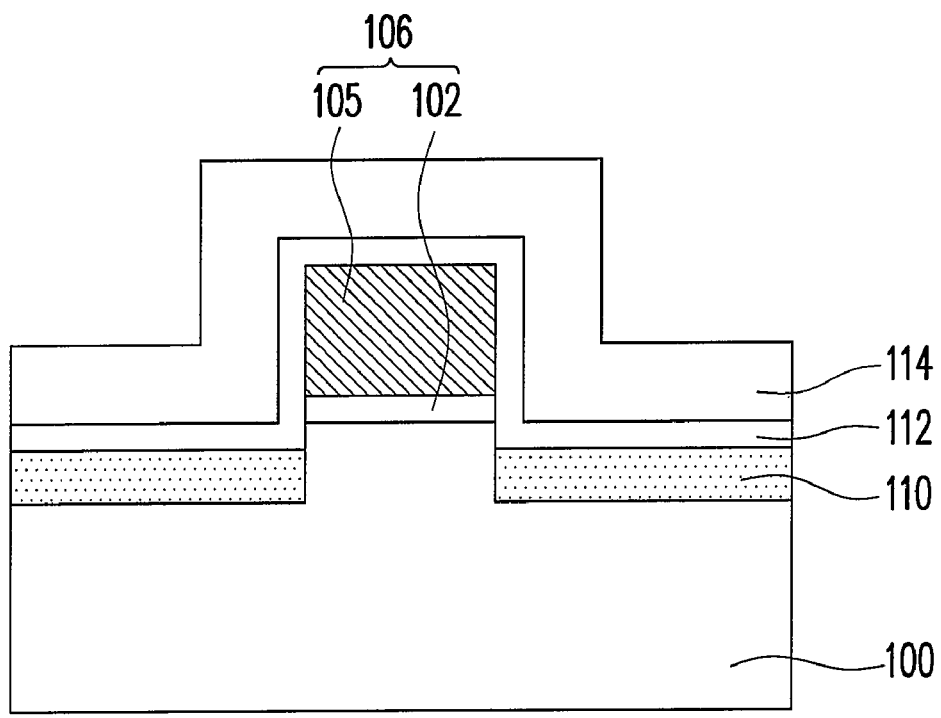

Referring to FIG. 3D, the gate dielectric layer 102 exposed by the gate electrode 105 and the offset oxide layer 134 are removed. The remaining gate dielectric layer 102 and the gate electrode 105 constitute a gate structure 106. Thereafter, a conformal offset spacer material layer 112 such as a conformal oxide layer is formed on the substrate 100 to cover the gate structure 106 and the substrate 100. The conformal offset spacer material layer 112 can be silicon oxide formed by CVD and using tetra ethyl ortho silicate (TEOS)/ozone, for example. The thickness of the conformal offset spacer material layer 112 is about 50-300 Å, for example. Then a conformal spacer material layer 114 such as conformal dielectric layer is formed on the conformal offset spacer material layer 112 to cover the substrate 100 and the gate structure 106. The conformal spacer material layer 114 has a high etching selectivity related to the oxide layer, and the conformal spacer material layer 114 will not be affected when removing the native oxide layer. The conformal spacer material layer 114, for example, is made of silicon nitride by CVD. The thickness of the dielectric layer is usually larger than that of the oxide layer.

Figure 3E:
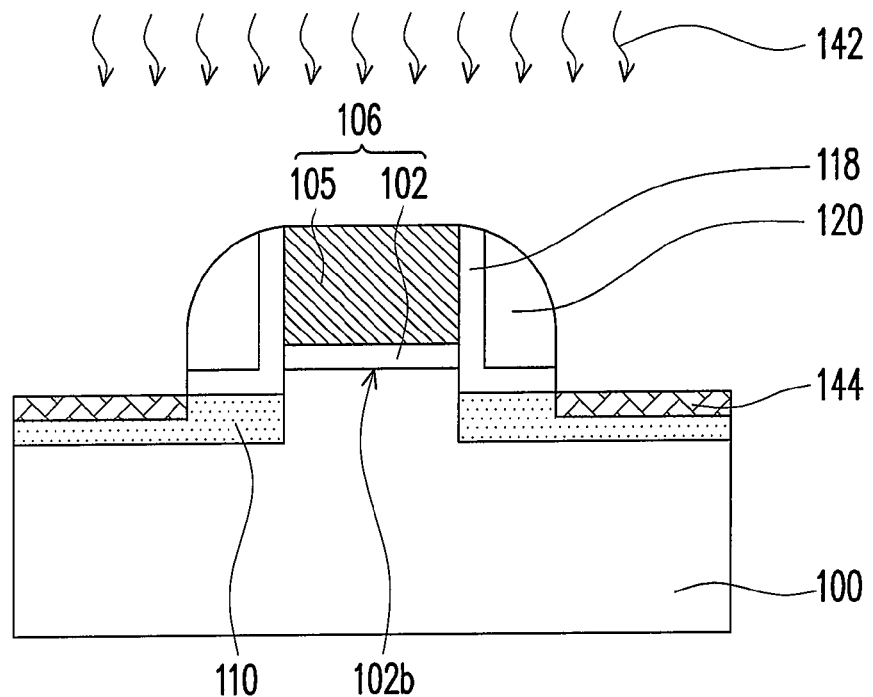

Referring to FIG. 3E, a portion of the conformal spacer material layer 114 and the conformal offset spacer material layer 112 are removed until the substrate 100 is exposed to remain the spacer material layer 114 and the offset spacer material layer 112, wherein the remaining offset spacer material layer at the sidewall of the gate electrode 105 can be deemed as an offset spacer 118 and the remaining conformal spacer material layer 114 surround the offset spacer 118 can be deemed as a spacer 120. The thickness of the offset spacer 118, e.g., 50-200 Å, is smaller than that of the spacer 120. The portion of the conformal spacer material layer 114 and offset spacer material layer the can be removed by anisotropic etching such as reactive ion etching (RIE).

In order to protect the substrate 100 from damage due to the subsequent ion implantation and forming uniform depth of the source/drain contact region after the ion implantation, an oxidation process 142 is performed. The oxidation process 142 can be an oxygen plasma treatment process. In the oxygen plasma treatment process, a gas source including oxygen is flowed into the chamber to generate the plasma and the DC power of 100-2000 W is applied, for example. With the oxidation process 142, oxygen atoms are implanted to the surface of the substrate 100, especially the substrate 100 predetermined for forming source/drain contact region, and reacted with the substrate 100 to form silicon oxide. That is, a thin oxide layer will be formed on the surface of the substrate 100 so that an offset oxide layer 144 with a uniform thickness is formed. The applied DC power, the implantation dosage and the treatment time can be adjusted based on the required thickness of the offset oxide layer.

Because the oxidation process 142 is performed by using the spacer 120 and the gate structure 106 as masks, the implanted oxygen atoms only react with the exposed surface of the substrate 100. The implanted oxygen atoms will only react with the silicon atoms of the substrate (consuming the silicon atoms of the substrate) to form the uniform offset oxide layer 144.

The implanted oxygen atoms will also be implanted into the gate electrode 105 through the oxide layer covering the top surface of the gate electrode 105. If the material of the gate electrode 105 is polysilicon, the implanted oxygen atoms will react with the polysilicon to form silicon oxide so that the oxide layer on the gate electrode 105 will become thicker. However, because the depth of the implanted oxygen atoms is not too deep, it will not consume too much silicon in the polysilicon layer and the performance of the gate structure will not be seriously affected.

Referring to FIG. 3E, an ion implantation process 126 is performed by using the spacer 120 and the gate structure 106 as masks to form the doped source/drain contact region 128 in the substrate 100 at the two sides of the spacer 120 and the gate structure 106. Because there is a uniform offset oxide layer 144 on the substrate, the depth of the source/drain contact region 128 is uniform and the effective channel length is unvaried.

Later, if necessary, a self-align silicide process can be performed depending on the types of the devices. Because the self-align silicide process is well known by the one skilled in the art, no detailed description is necessary. Before self-align silicide process, an additional cleaning process is required to remove the oxide layer and the impurity between the gate and the surface of the substrate. The aforementioned offset oxide layer will also be removed.

Figure 3F:
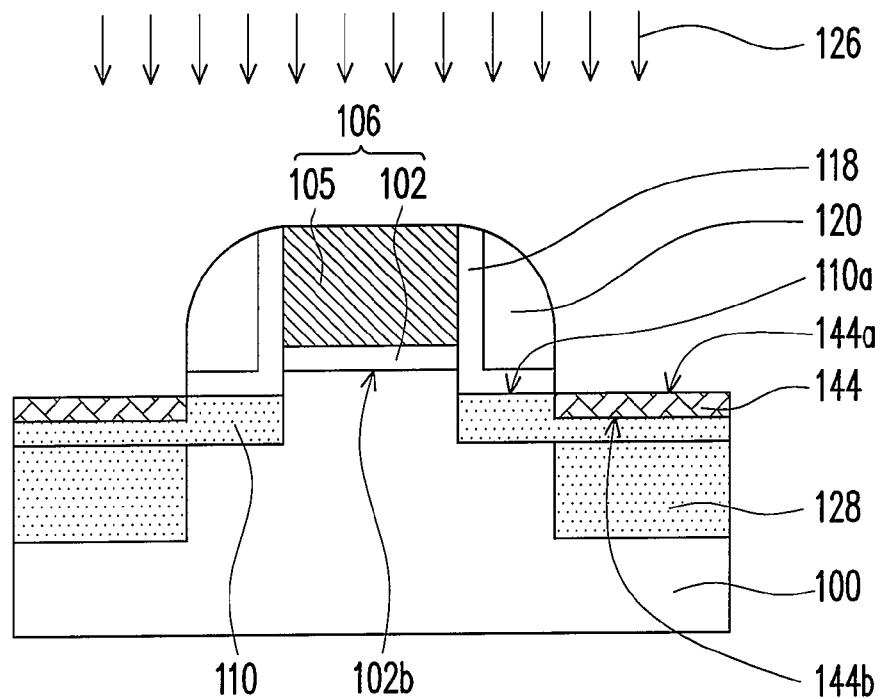

The semiconductor device based on the above embodiment as shown in FIG. 3F comprises: a substrate 100; a gate structure 106 on the substrate 100, the gate structure 106 including a gate dielectric layer 102 on the substrate 100 and a gate electrode 105 on the gate dielectric layer 102; an offset spacer 118 on a sidewall of the gate structure 106; a spacer 120 on the offset spacer 118 and having a width being not smaller than a width of the offset spacer 118; source/drain extension region 110 having a top surface 110a below a bottom surface 102b of the gate dielectric layer 102; a source/drain contact region 128 in the substrate 100 besides the spacer 120 and the gate structure 106; and an offset oxide layer 144 covering the source/drain contact region 128 in the substrate 100 and. The offset oxide layer 144 having a top surface 144a below a bottom surface 102b of the gate dielectric layer 102 and a bottom surface 144b below a top surface 110a of the source/drain extension region 110.

The Second Embodiment

FIGS. 4A-4F show the cross-sectional view of the process for fabricating a semiconductor device in accordance with the second embodiment of the present invention.

Figure 4A:
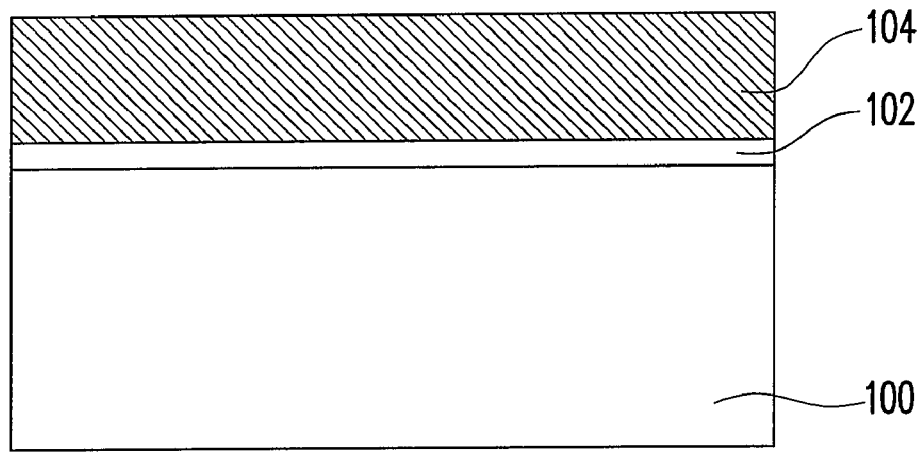
FIGS. 4A-4F show the cross-sectional view of the process for fabricating a semiconductor device in accordance with the second embodiment of the present invention.
Figure 4B:
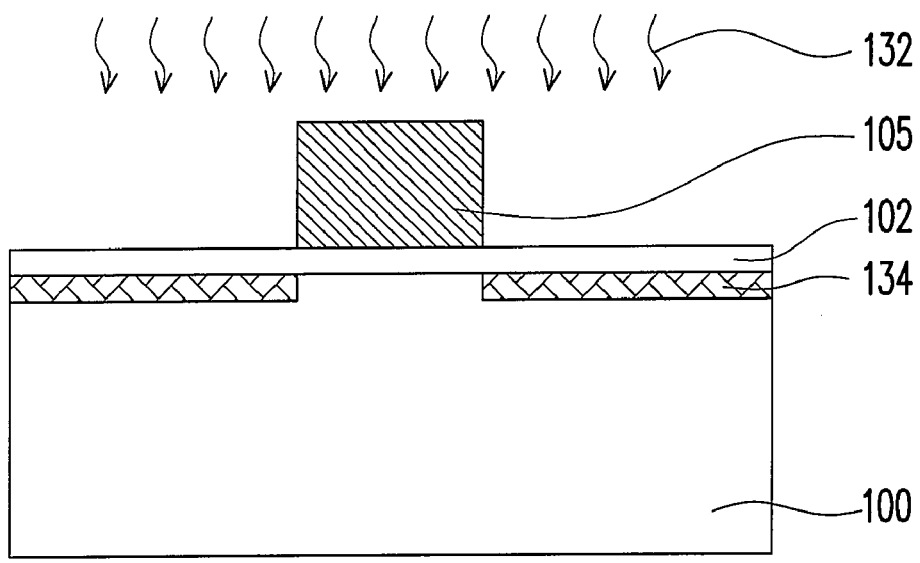
Figure 4C:
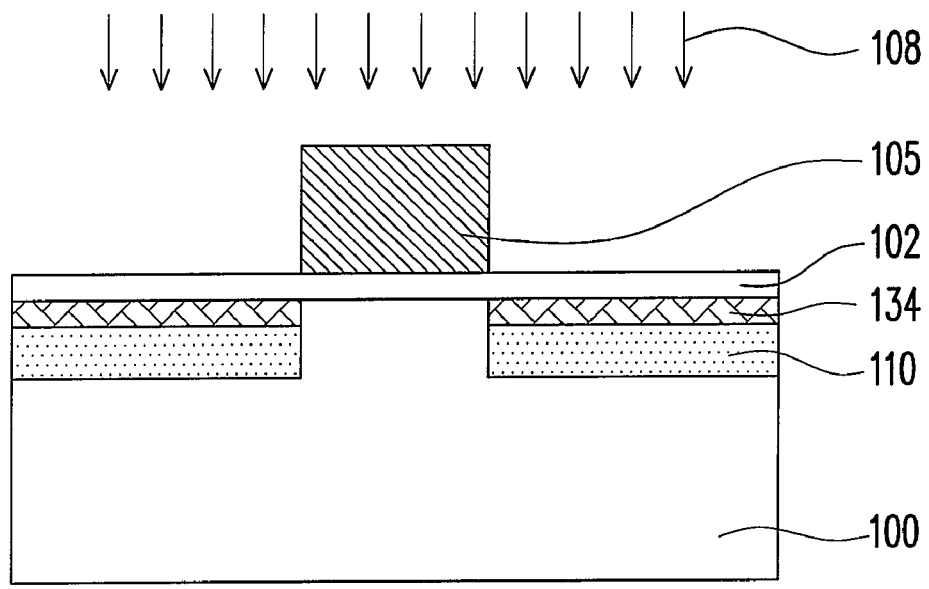
Figure 4D:
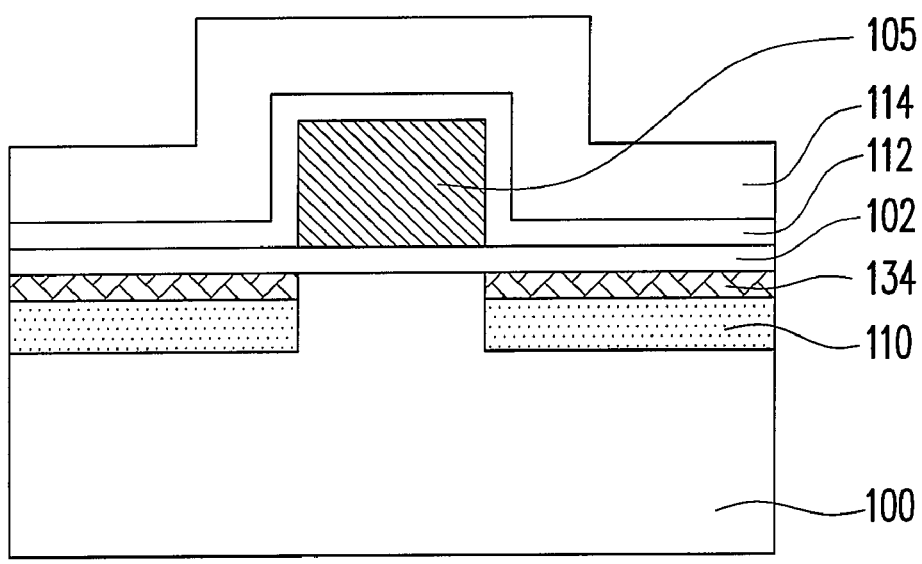
Figure 4E:
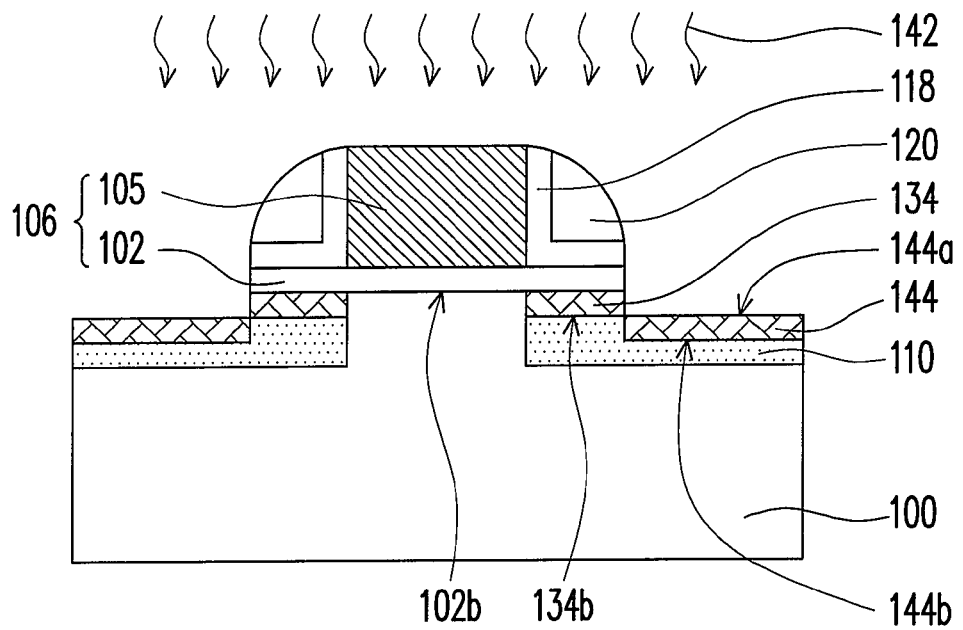

In the above embodiment, the gate dielectric layer 102 exposed by the gate electrode 105 and the offset oxide layer 134 are removed before the conformal offset spacer material layer 112 is formed. Referring to FIG. 4A-4F, in the second embodiment, the gate dielectric layer 102 exposed by the gate electrode 105 and the offset oxide layer 134 are not removed before the conformal offset spacer material layer 112 is formed (as shown in FIG. 4D). The gate dielectric layer 102 and the offset oxide layer 134 exposed by the gate electrode 105 are removed after the offset spacer 118 and spacer 120 are formed and before the oxidation process 142 is performed (as shown in FIG. 4E).

Figure 4F:
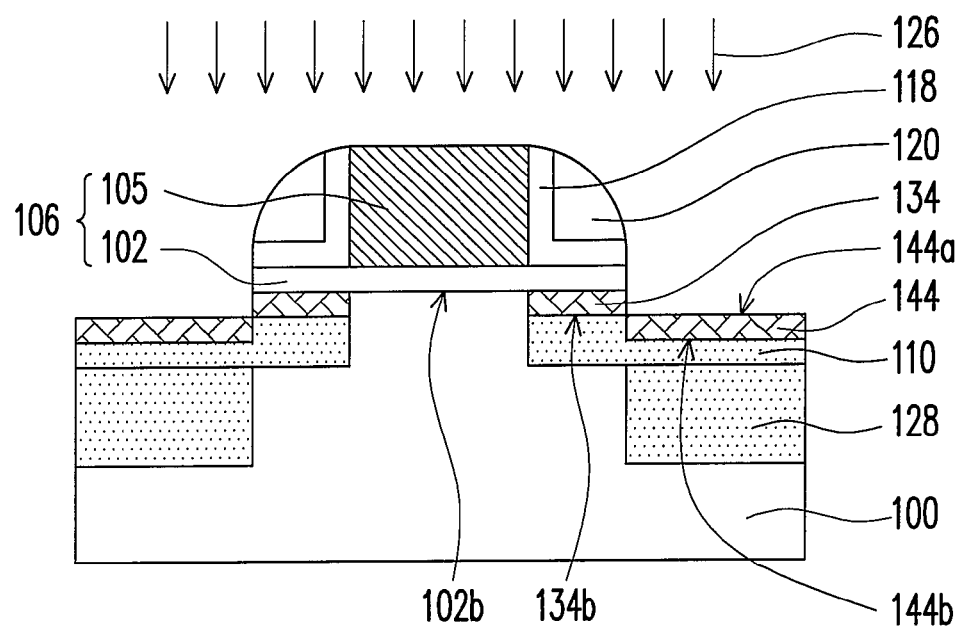

The semiconductor device based on the above embodiment as shown in FIG. 4F comprises: a substrate 100; a gate structure 106 on the substrate 100, the gate structure 106 including a gate dielectric layer 102 on the substrate 100 and a gate electrode 105 on a portion of the gate dielectric layer 102; an offset spacer 118 on the gate dielectric layer 102 and on a sidewall of the gate electrode 105; a spacer 120 on the offset spacer 118 and having a width being not smaller than a width of the offset spacer 118; source/drain extension region 110 besides the gate electrode 105; a source/drain contact region 128 in the substrate 100 besides the spacer 120 and the gate structure 106; offset oxide layer 134 covering the source/ drain extension region 110, the offset oxide layer 134 having a bottom surface 134b below a bottom surface 102b of the gate dielectric layer 102; and an offset oxide layer 144 covering the source/drain contact region 128 in the substrate 100. The offset oxide layer 144 having a top surface 144a below a bottom surface 102b of the gate dielectric layer 102 and having a bottom surface 144b below a bottom surface 134b of the offset oxide layer 134.

The Third Embodiment

FIGS. 5A-5F show the cross-sectional view of the process for fabricating a semiconductor device in accordance with the third embodiment of the present invention.

Figure 5A:
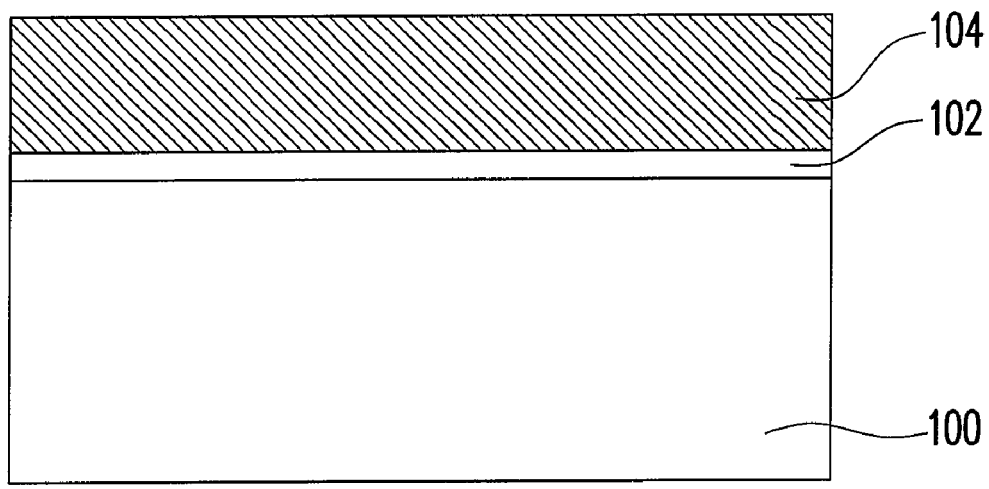
FIGS. 5A-5F show the cross-sectional view of the process for fabricating a semiconductor device in accordance with the third embodiment of the present invention.
Figure 5B:
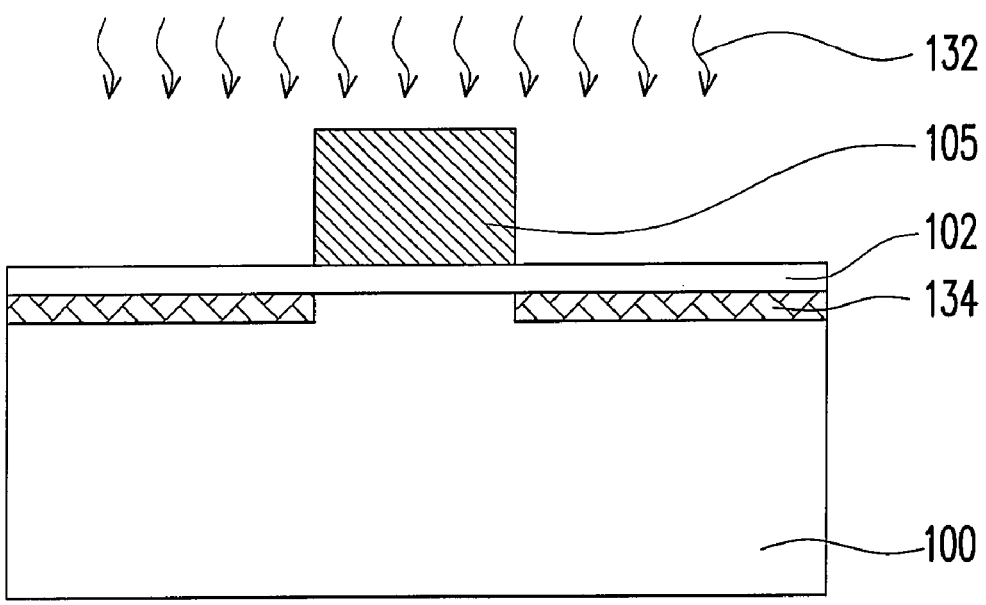
Figure 5C:
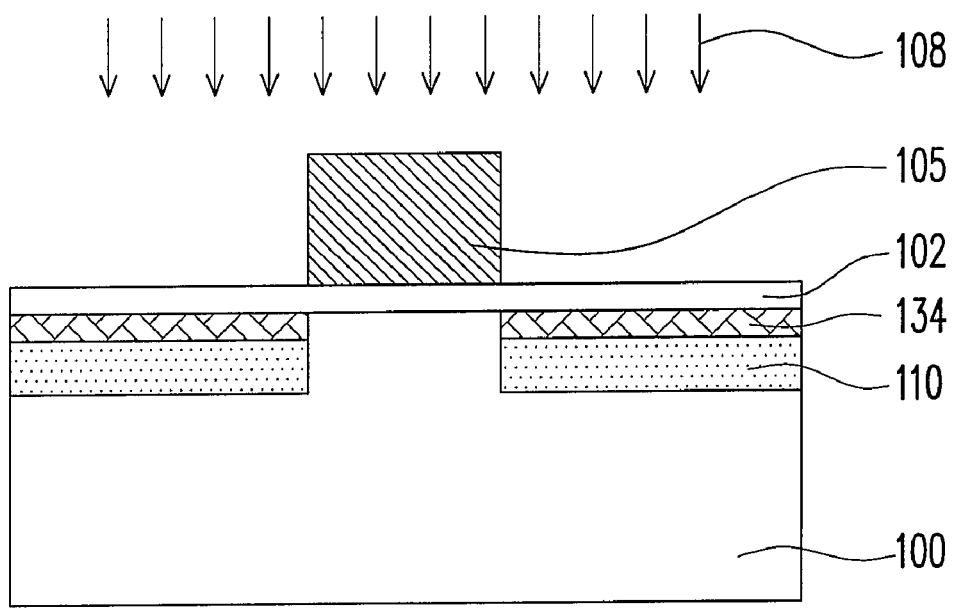
Figure 5D:
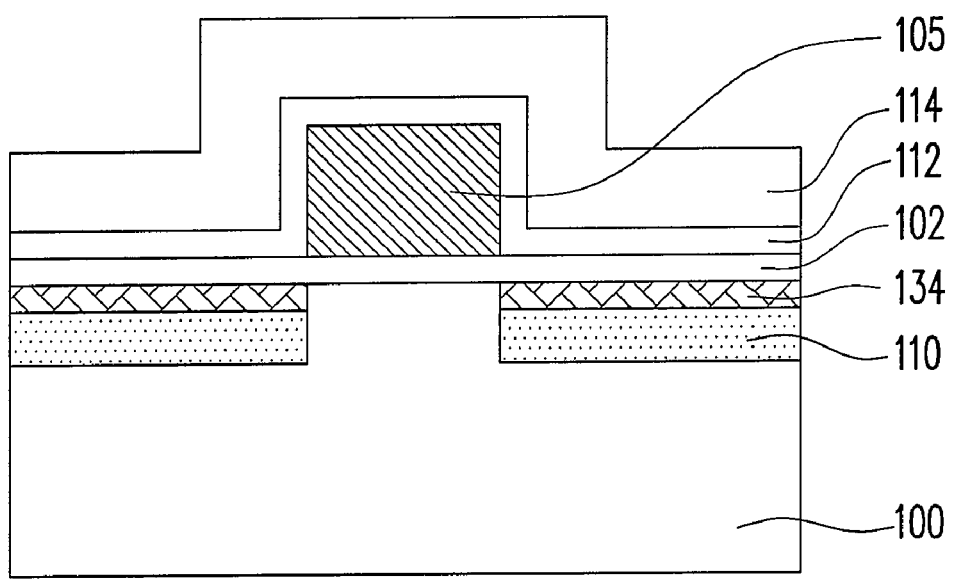
Figure 5E:
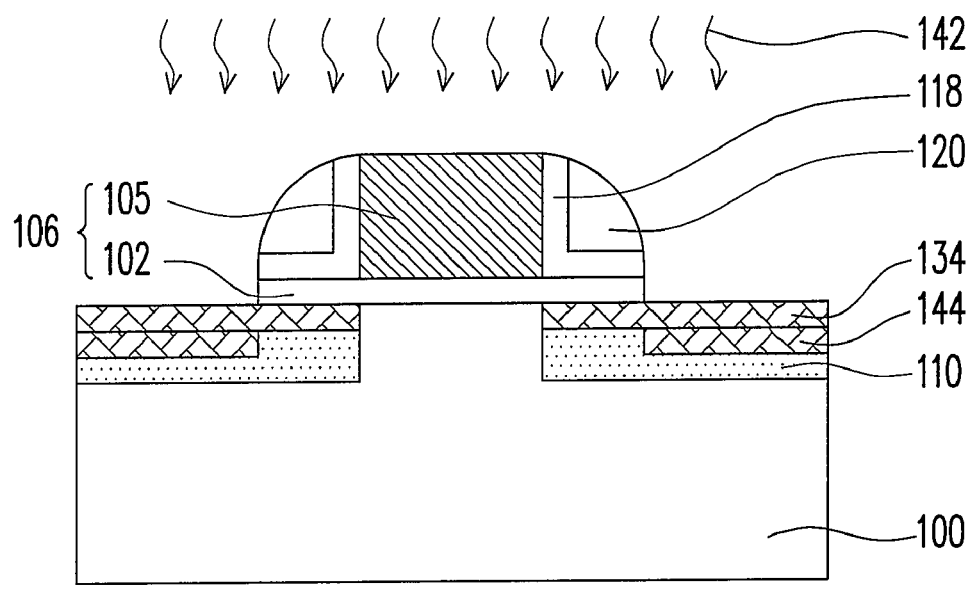
Figure 5F:
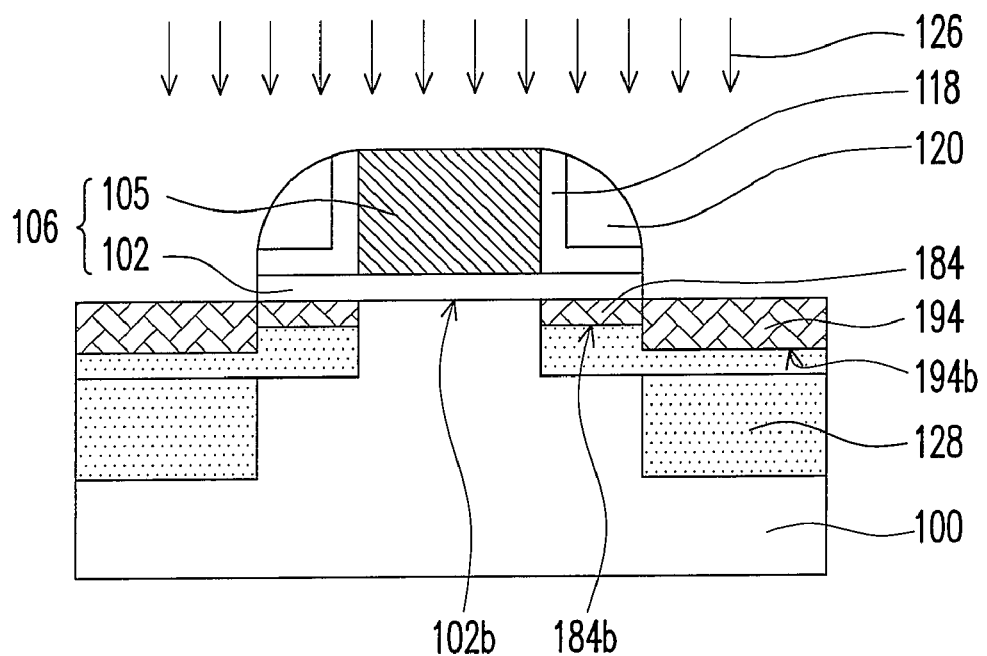

Alternatively, referring to FIG. 5A-5F, in the third embodiment of the present invention, the gate dielectric layer 102 exposed by the gate electrode 105 and the offset oxide layer 134 are not removed before the offset spacer 118 and the spacer 120 are formed. The gate dielectric layer 102 exposed by the gate electrode 105 is removed selectively and the offset oxide layer 134 is remained before the oxidation process 142 is performed (as shown in FIG. 5E). After oxidation process 142 is performed, the offset oxide layer 134 on the source/drain extension region 110 represents offset oxide layer 184, and the offset oxide layer 134 and the offset oxide layer 144 on the source/drain extension region 128 represents offset oxide layer 194 (as shown in FIG. 5F).

The semiconductor device based on the above embodiment as shown in FIG. 5F comprises: a substrate 100; a gate structure 106 on the substrate 100, the gate structure 106 including a gate dielectric layer 102 on the substrate 100 and a gate electrode 105 on the gate dielectric layer 102; an offset spacer 118 on a portion of the gate dielectric layer 102 and on a sidewall of the gate electrode 105; a spacer 120 on the offset spacer 118 and having a width being not smaller than a width of the offset spacer 118; source/drain extension region 110 besides the gate electrode 105; a source/drain contact region 128 in the substrate 100 besides the spacer 120 and the gate structure 106; offset oxide layer 184 covering the source/drain extension region 110, the offset oxide layer 184 having a bottom surface 184b below a bottom surface 102b of the gate dielectric layer 102; and an offset oxide layer 194 covering the source/drain contact region 128 in the substrate 100. The offset oxide layer 194 having a bottom surface 194b below the bottom surface 184b of the offset oxide layer 184.

The Fourth Embodiment

FIGS. 6A-6F show the cross-sectional view of the process for fabricating a semiconductor device in accordance with the fourth embodiment of the present invention.

Figure 6A:
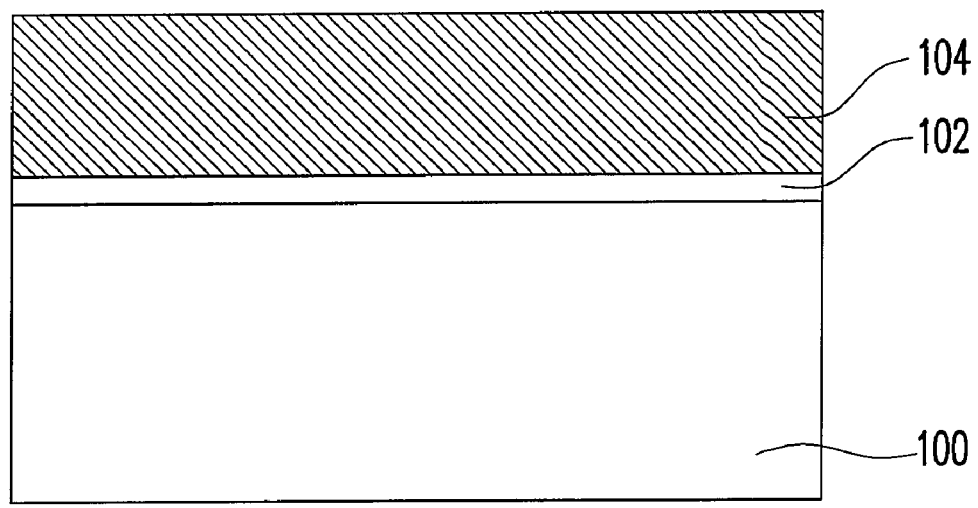
FIGS. 6A-6F show the cross-sectional view of the process for fabricating a semiconductor device in accordance with the fourth embodiment of the present invention.

Referring to FIG. 6A, a substrate 100 such as a silicon substrate is provided. The substrate 100 includes an isolation structure (not shown) such as LOCOS or STI, and other semiconductor devices. A gate dielectric layer 102 such as silicon oxide layer is formed on the substrate 100. A gate conductive layer 104 is formed on the gate dielectric layer 102. The gate dielectric layer 102 is, for example, an oxide layer. The gate conductive layer 104 can be doped polysilicon formed by in-situ doping by CVD, for example.

Figure 6B:
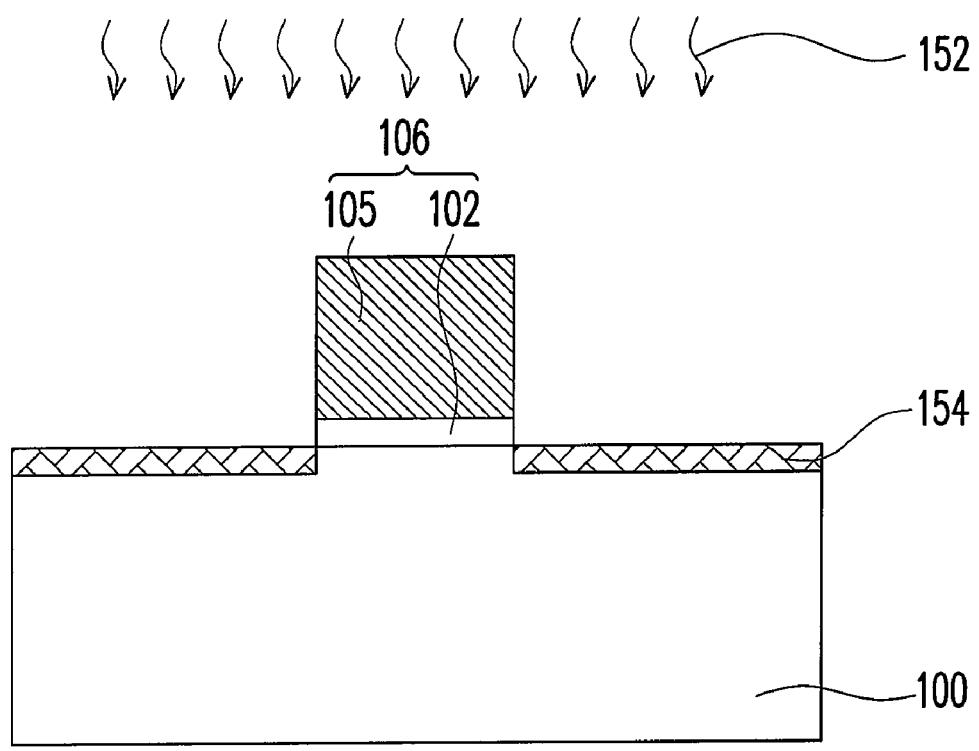

Referring to FIG. 6B, a gate electrode 105 is formed by defining the gate conductive layer 104 using photolithographic and etching technology with the gate dielectric layer 102 as a etching stop layer. Thereafter, the gate dielectric layer 102 exposed by the gate electrode 105 is removed by using an isotropic etching process such as a dip process with dilute hydrochloric acid solution or buffer oxide etcher (BOE) solution. The gate electrode 105 and the patterned gate dielectric layer 102 constitute a gate structure 106.

In order to protect the surface of the substrate 100 from damage due to the subsequent ion implantation and forming uniform depth of source/drain extension region after the ion implantation, an oxidation process 152 is performed. The oxidation process 152 can be an oxygen plasma treatment process, a thermal oxidation process or a RTA oxidation process. When the oxidation process 152 is performed by the oxygen plasma treatment process, a gas source including oxygen is flowed into the chamber to generate the plasma and the DC power of 100-2000 W is applied, for example. When oxidation process 152 is performed by thermal oxidation process, thermal oxidation process can be a dry thermal process using oxygen as a gas source, or a wet thermal process using $H_2O$ steam diluted with $N_2$. When oxidation process 152 is performed by the RTA process, the RTA process, a gas source including oxygen is flowed into the chamber. With the oxidation process 152, oxygen atoms are implanted to the surface of the substrate 100, especially the substrate 100 predetermined for forming source/drain extension region, and reacted with the substrate 100 to form silicon oxide. That is, a thin oxide layer will be formed below the gate dielectric layer 102 so that an offset oxide layer 154 with a uniform thickness is formed. The applied DC power, the implantation dosage and the treatment time can be adjusted based on the required thickness of the offset oxide layer.

The oxygen atoms will also react with the exposed surface of gate electrode 105. If the material of the gate electrode 105 is polysilicon, the implanted oxygen atoms will react with the polysilicon to form silicon oxide so that an oxide layer (not shown) on the gate electrode 105 will be formed. However, because the depth of the implanted oxygen atoms is not too deep, it will not consume too much silicon in the polysilicon layer and the performance of the gate structure will not be seriously affected.

Figure 6C:
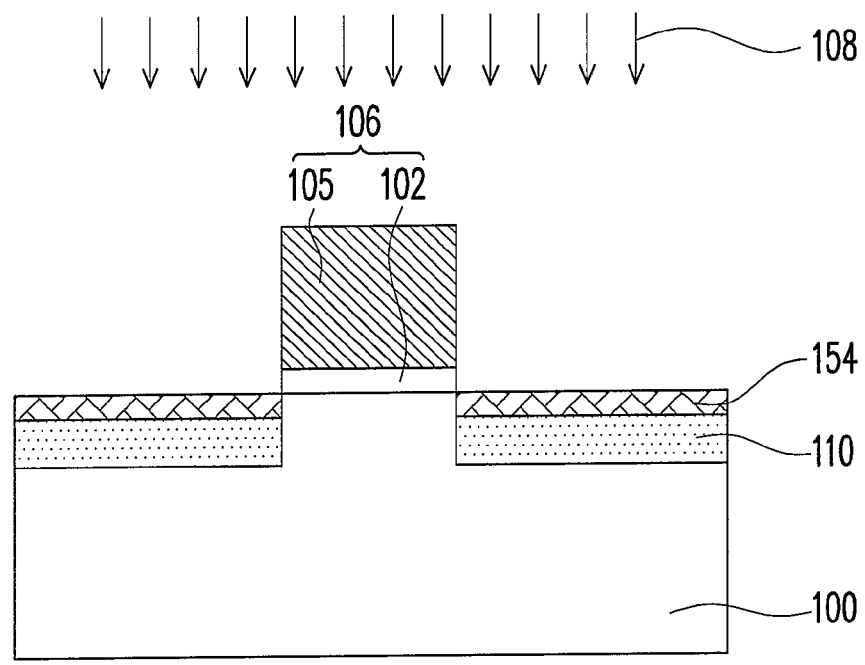

Referring to FIG. 6C, an ion implantation process 108 is performed by using the gate electrode 105 as a mask to form the source/drain extension region 110 in the substrate 100 at the two sides of the gate structure 106. Since the offset oxide layer 134 has a uniform thickness, the depth of source/drain region 110 is uniform.

Figure 6D:
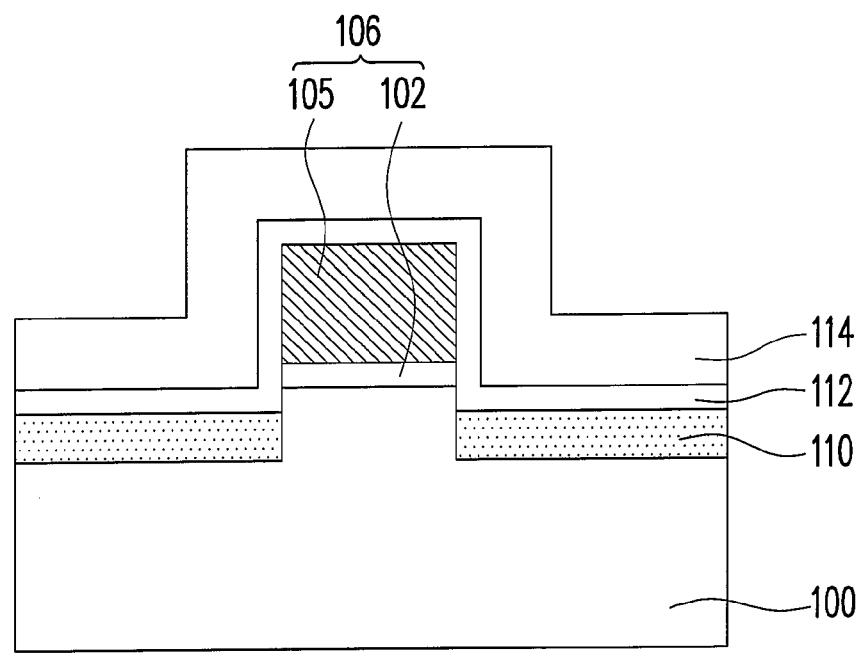

Referring to FIG. 6D, the gate dielectric layer 102 and the offset oxide layer 154 exposed by the gate electrode 105 are removed. Thereafter, a conformal offset spacer material layer 112 is formed on the substrate 100 to cover the gate structure 106 and the substrate 100. The conformal offset spacer material layer 112 can be silicon oxide formed by CVD and using tetra ethyl ortho-silicate (TEOS)/ozone, for example. The thickness of the conformal offset spacer material layer 112 is about 50-300 Å, for example. Then a conformal spacer material layer 114 is formed on the conformal offset spacer material layer 112 to cover the substrate 100 and the gate structure 106. The conformal spacer material layer 114 has a high etching selectivity related to the oxide layer, and the conformal spacer material layer 114 will not be affected when removing the native oxide layer. The conformal spacer material layer 114, for example, is made of silicon nitride by CVD. The thickness of the dielectric layer is usually larger than that of the oxide layer.

Figure 6E:
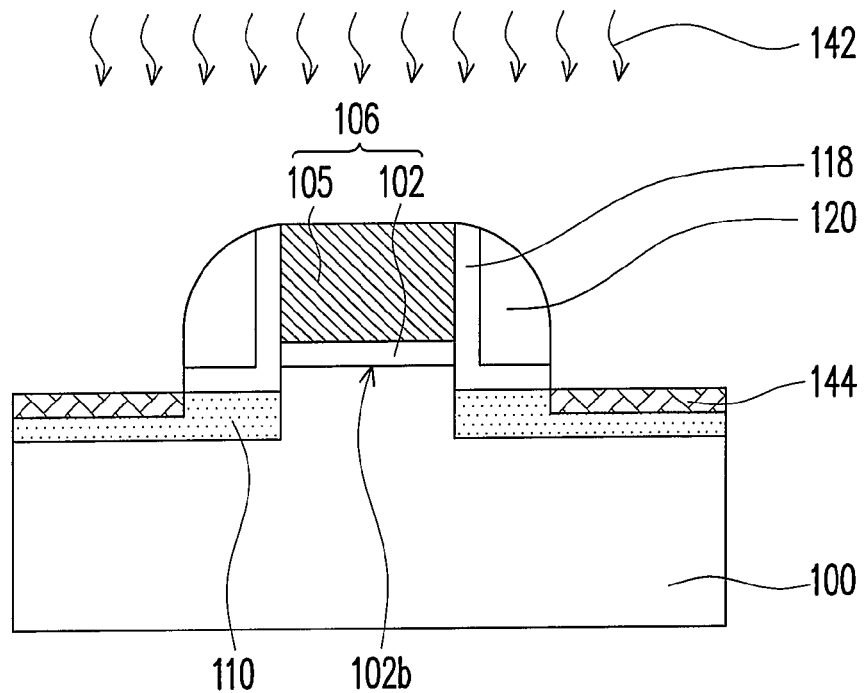

Referring to FIG. 6E, a portion of the conformal spacer material layer 114 and the conformal offset spacer material layer 112 are removed until the substrate 100 is exposed to remain the conformal spacer material layer 114 and the conformal offset spacer material layer 112, wherein the remaining offset spacer material layer at the sidewall of the gate electrode 105 can be deemed as an offset spacer 118 and the remaining conformal spacer material layer 114 surround the offset spacer 118 can be deemed as a spacer 120. The thickness of the offset spacer 118, e.g., 50-200 Å, is smaller than that of the spacer 120. The portion of the conformal spacer material layer 114 and offset spacer material layer the can be removed by anisotropic etching such as reactive ion etching (RIE).

In order to protect the substrate 100 from damage due to the subsequent ion implantation and forming uniform depth of the source/drain contact region after the ion implantation, an oxidation process 142 is performed. The oxidation process 142 can be an oxygen plasma treatment process. In the oxygen plasma treatment process, a gas source including oxygen is flowed into the chamber to generate the plasma and the DC power of 100-2000 W is applied, for example. With the oxidation process 142, oxygen atoms are implanted to the surface of the substrate 100, especially the substrate 100 predetermined for forming source/drain contact region, and reacted with the substrate 100 to form silicon oxide. That is, a thin oxide layer will be formed on the surface of the substrate 100 so that an offset oxide layer 144 with a uniform thickness is formed. The applied DC power, the implantation dosage and the treatment time can be adjusted based on the required thickness of the offset oxide layer.

Because the oxidation process 142 is performed by using the spacer 120 and the gate structure 106 as masks, the implanted oxygen atoms only react with the exposed surface of the substrate 100. The implanted oxygen atoms will only react with the silicon atoms of the substrate (consuming the silicon atoms of the substrate) to form the uniform offset oxide layer 144.

The implanted oxygen atoms will also be implanted into the gate electrode 105 through the oxide layer covering the top surface of the gate electrode 105. If the material of the gate electrode 105 is polysilicon, the implanted oxygen atoms will react with the polysilicon to form silicon oxide so that the oxide layer on the gate electrode 105 will become thicker. However, because the depth of the implanted oxygen atoms is not too deep, it will not consume too much silicon in the polysilicon layer and the performance of the gate structure will not be seriously affected.

Figure 6F:
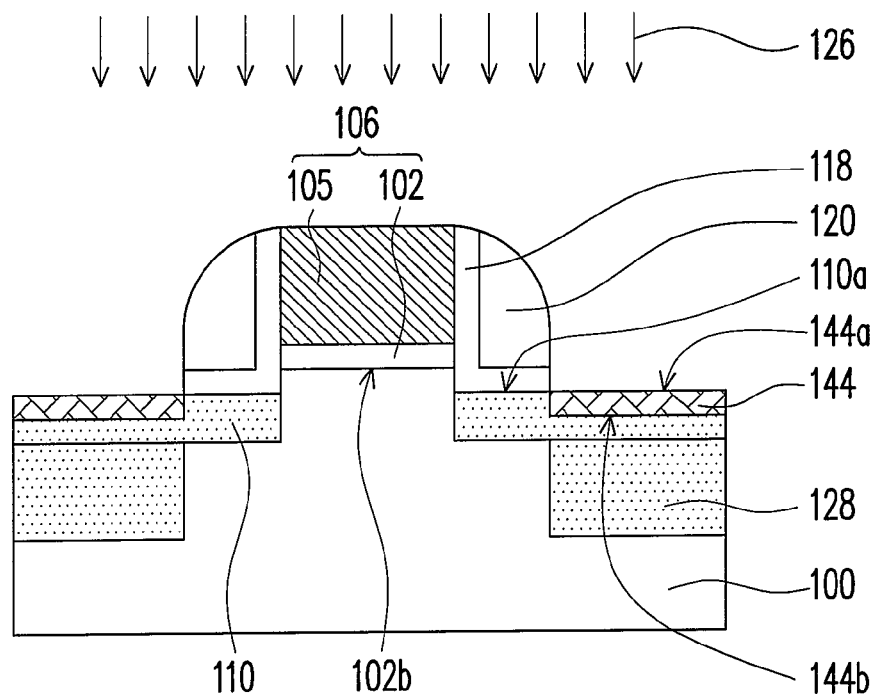

Referring to FIG. 6F, an ion implantation process 126 is performed by using the spacer 120 and the gate structure 106 as masks to form the doped source/drain contact region 128 in the substrate 100 at the two sides of the spacer 120 and the gate structure 106. Because there is a uniform offset oxide layer 144 on the substrate, the depth of the source/drain contact region 128 is uniform and the effective channel length is unvaried.

Later, if necessary, a self-align silicide process can be performed depending on the types of the devices. Because the self-align silicide process is well known by the one skilled in the art, no detailed description is necessary. Before self-align silicide process, an additional cleaning process is required to remove the oxide layer and the impurity between the gate and the surface of the substrate. The aforementioned offset oxide layer will also be removed.

The semiconductor device based on the above embodiment as shown in FIG. 6F comprises: a substrate 100; a gate structure 106 on the substrate 100, the gate structure 106 including a gate dielectric layer 102 on the substrate 100 and a gate electrode 105 on the gate dielectric layer 102; an offset spacer 118 on a sidewall of the gate structure 106; a spacer 120 on the offset spacer 118 and having a width being not smaller than a width of the offset spacer 118; source/drain extension region 110 having a top surface 110a below a bottom surface 102b of the gate dielectric layer 102; a source/drain contact region 128 in the substrate 100 besides the spacer 120 and the gate structure 106; and an offset oxide layer 144 covering the source/drain contact region 128 in the substrate 100 and. The offset oxide layer 144 having a top surface 144a below a bottom surface 102b of the gate dielectric layer 102 and a bottom surface 144b below a top surface 110a of the source/drain extension region 110.

The Fifth Embodiment

Figure 7A:
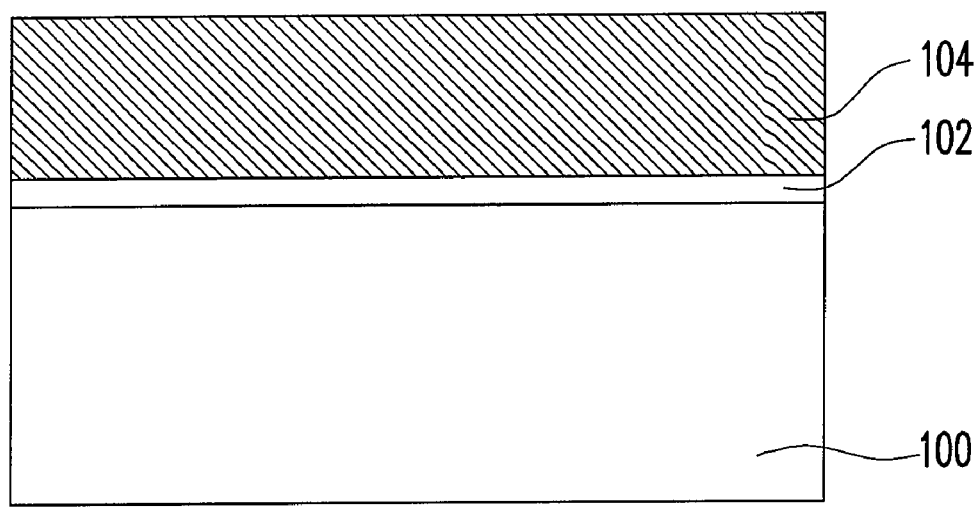
FIGS. 7A-7F show the cross-sectional view of the process for fabricating a semiconductor device in accordance with the fifth embodiment of the present invention.
Figure 7B:
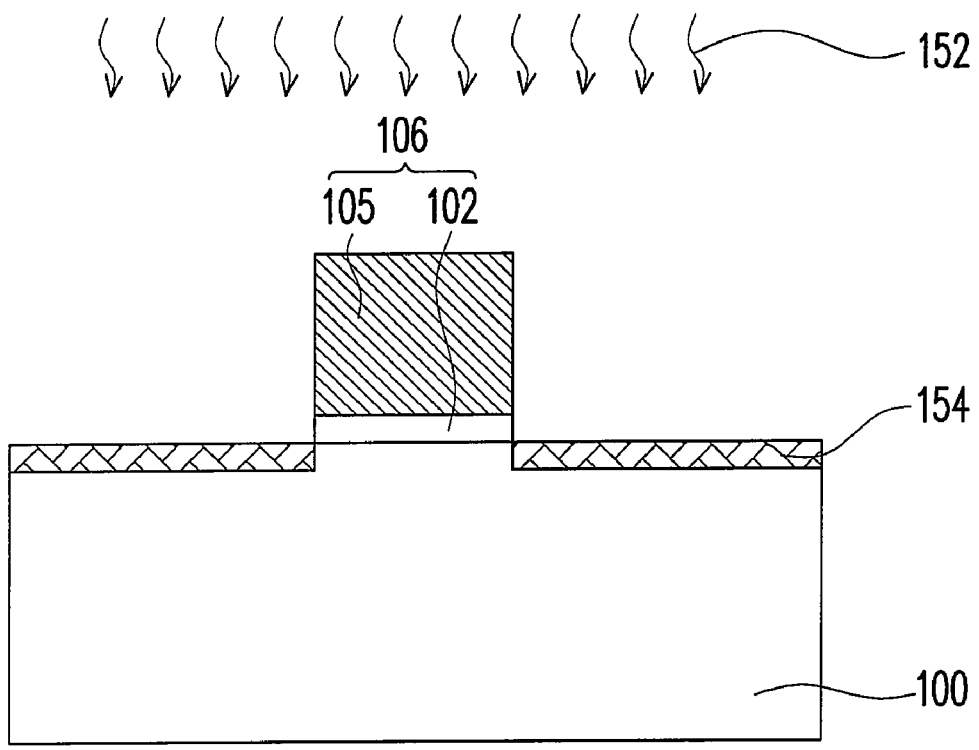
Figure 7C:
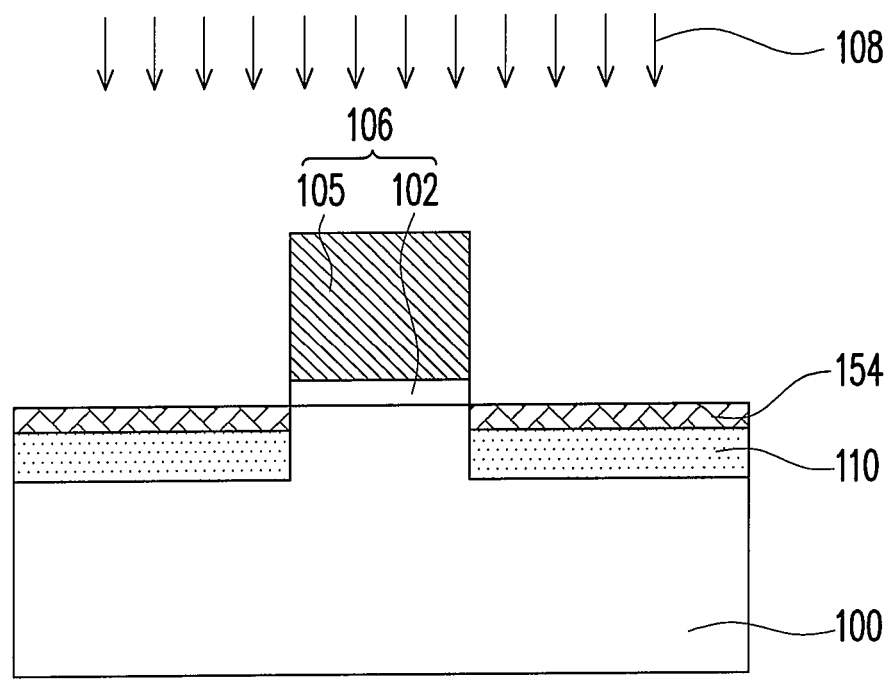
Figure 7D:
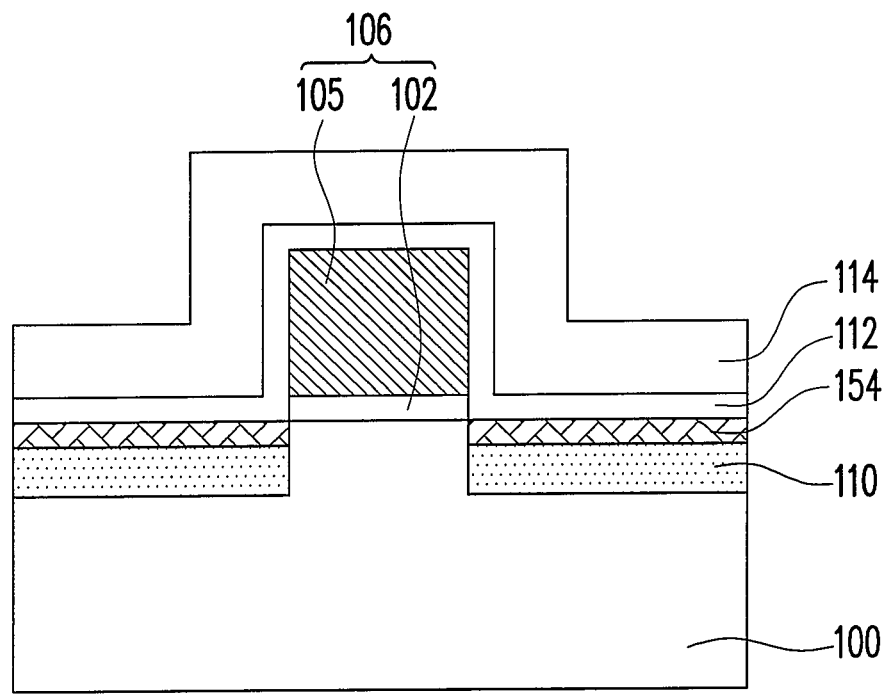
Figure 7E:
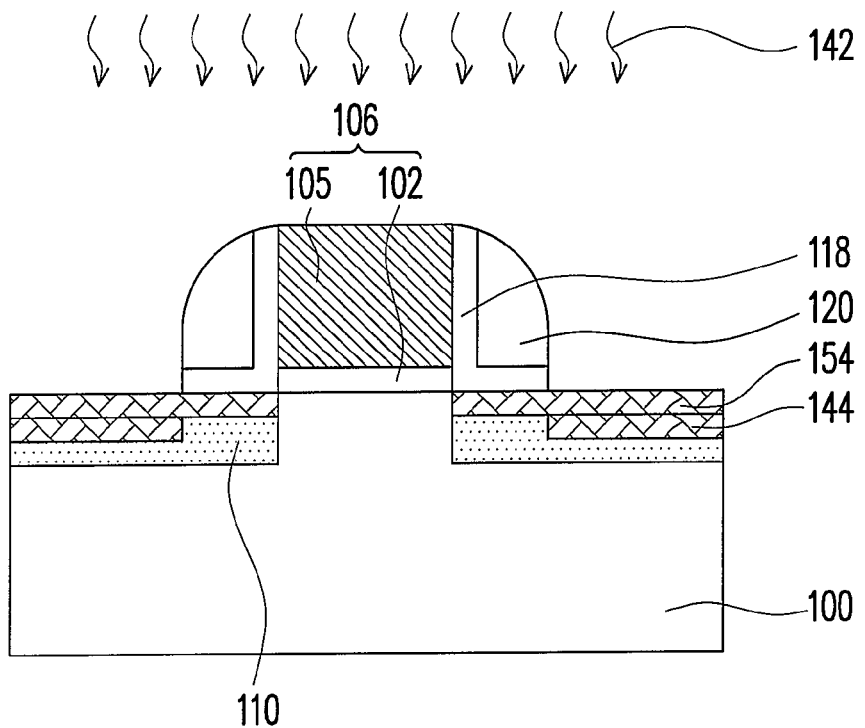
Figure 7F:
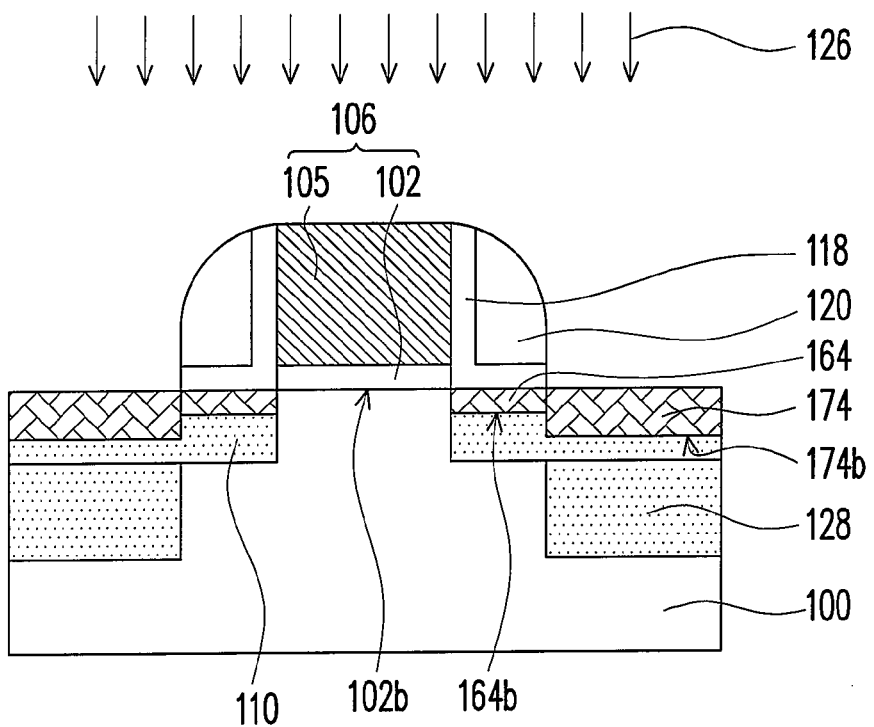

FIGS. 7A-7F show the cross-sectional view of the process for fabricating a semiconductor device in accordance with the fifth embodiment of the present invention Referring to FIG. 6D, in the fourth embodiment, the offset oxide layer 154 is removed before the conformal offset spacer material layer 112 is formed. Referring to FIG. 7A-7F, in the fourth embodiment, the offset oxide layer 154 is not removed before the conformal offset spacer material layer 112 is formed (as shown in FIG. 7D). The offset oxide layer 154 are remained after the source/drain contact region 128 is formed (as shown in FIGS. 7E and 7F). The offset oxide layer 154 on the source/drain extension region 110 represents offset oxide layer 164 and the offset oxide layer 154 and the offset oxide layer 144 on the source/drain extension region 128 represents offset oxide layer 174.

The semiconductor device based on the above embodiment as shown in FIG. 7F comprises: a substrate 100; a gate structure 106 on the substrate 100, the gate structure 106 including a gate dielectric layer 102 on the substrate 100 and a gate electrode 105 on the gate dielectric layer 102; an offset spacer 118 on a sidewall of the gate structure 106; a spacer 120 on the offset spacer 118 and having a width being not smaller than a width of the offset spacer 118; source/drain extension region 110 below the offset spacer 118; a source/drain contact region 128 in the substrate 100 besides the spacer 120 and the gate structure 106; an offset oxide layer 164 covering the source/drain extension region 110, the offset oxide layer 164 having a bottom surface 164b below a bottom surface 102b of the gate dielectric layer 102; and an offset oxide layer 174 covering the source/drain contact region 128 in the substrate 100. The bottom surface 174b of the offset oxide layer 174 on the source/drain contact region 128 is different from that of the offset oxide layer 164 on the source/drain extension region 110. The offset oxide layer 174 having a bottom surface 174b below a bottom surface 164b of the offset oxide layer 164.

The Sixth Embodiment

Figure 8A:
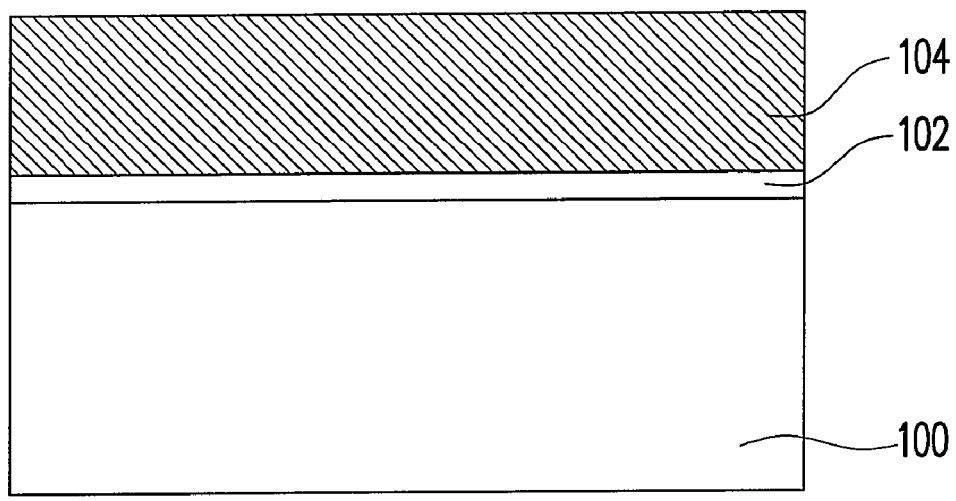
FIGS. 8A-8F show the cross-sectional view of the process for fabricating a semiconductor device in accordance with the sixth embodiment of the present invention.
Figure 8B:
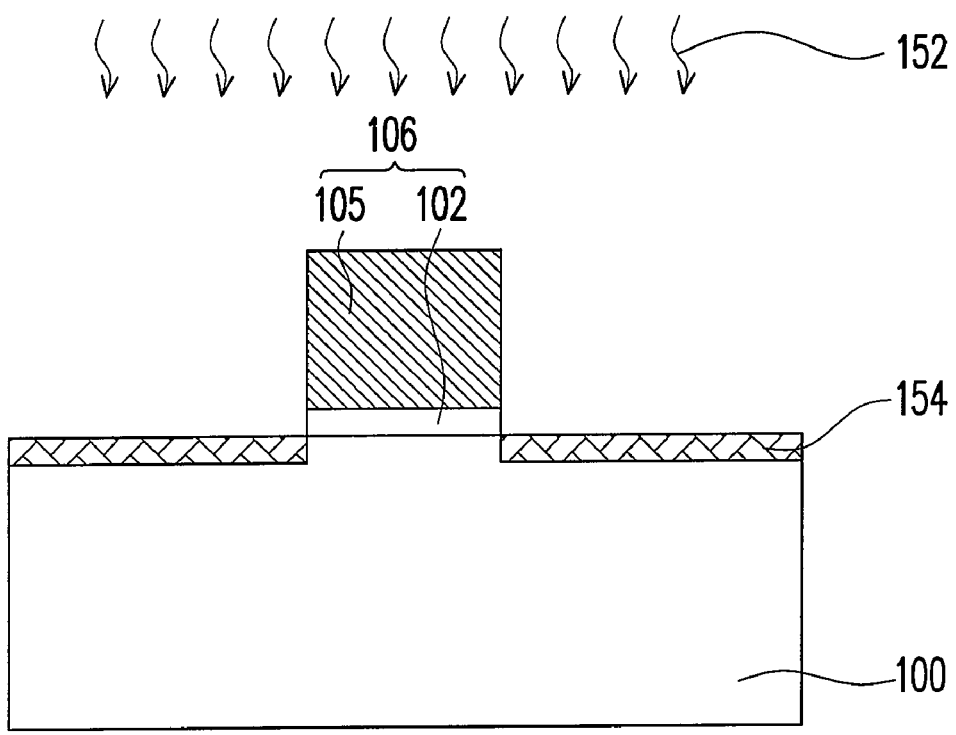
Figure 8C:
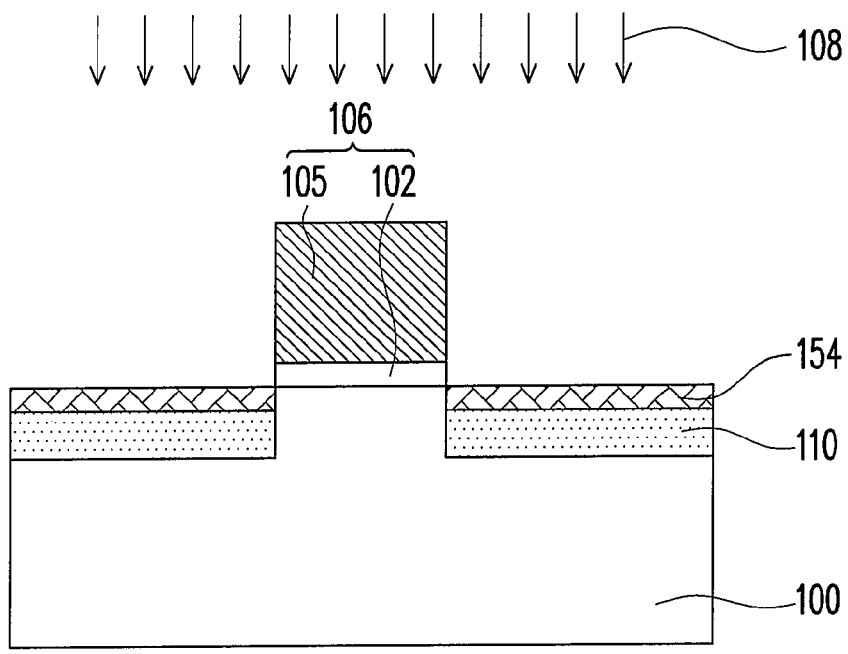
Figure 8D:
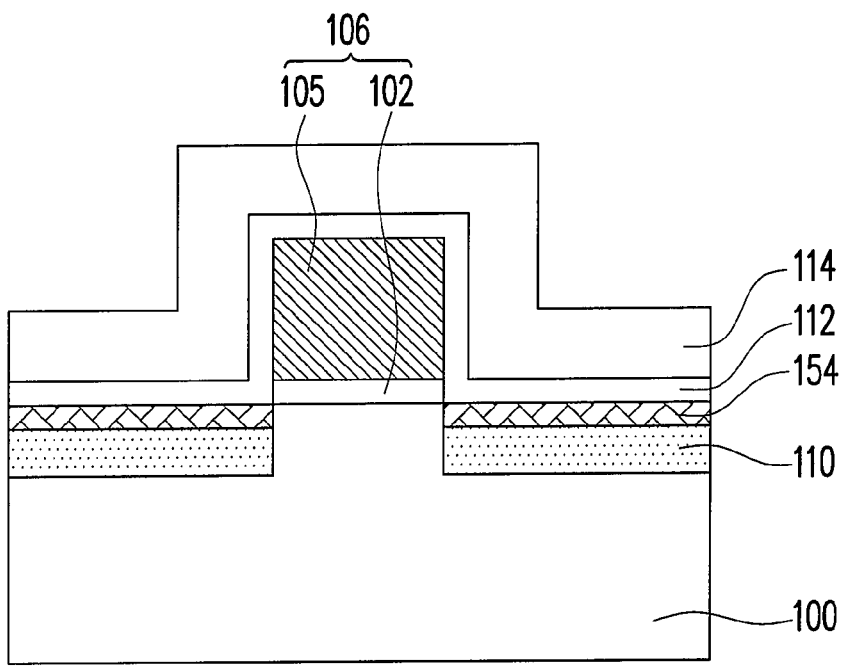
Figure 8E:
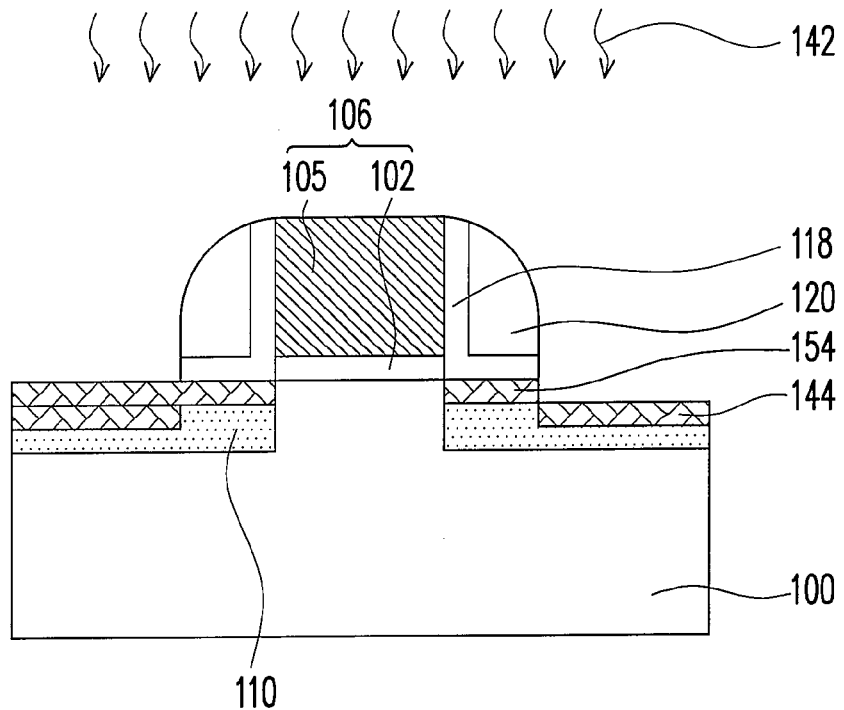

FIGS. 8A-8F show the cross-sectional view of the process for fabricating a semiconductor device in accordance with the sixth embodiment of the present invention Alternatively, referring to FIG. 8A-8F, in the sixth embodiment, the offset oxide layer 154 is not removed before the conformal offset spacer material layer 112 is formed (as shown in FIG. 8D). The offset oxide layer 154 is removed after the offset spacer 118 and spacer 120 are formed and before the oxidation process 142 is performed. the oxidation process 142 is performed (as shown in FIG. 8E).

Figure 8F:
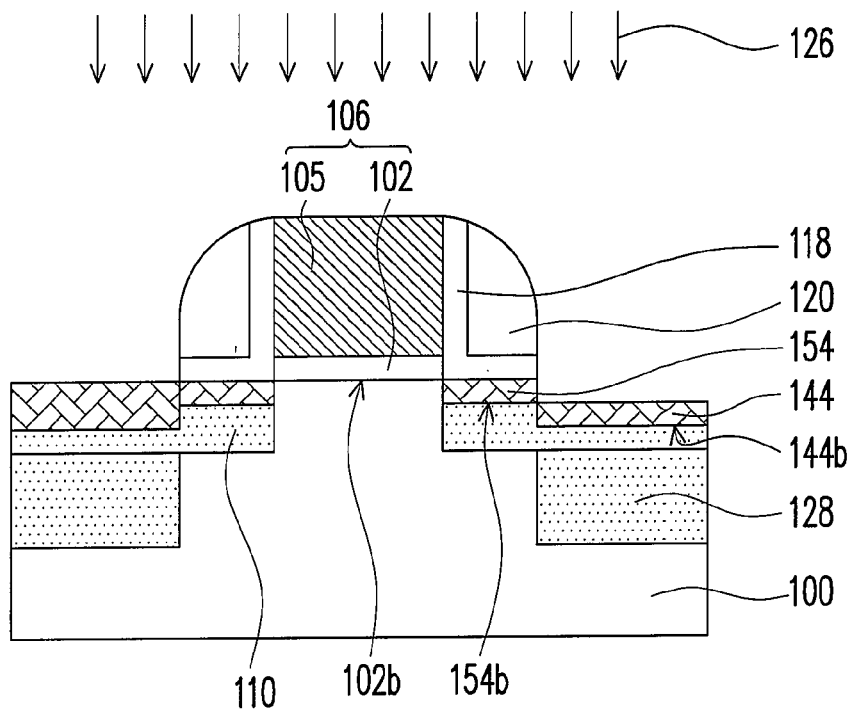

The semiconductor device based on the above embodiment as shown in FIG. 8F comprises: a substrate 100; a gate structure 106 on the substrate 100, the gate structure 106 including a gate dielectric layer 102 on the substrate 100 and a gate electrode 105 on the gate dielectric layer 102; an offset spacer 118 on a sidewall of the gate structure 106; a spacer 120 on the offset spacer 118 and having a width being not smaller than a width of the offset spacer 118; source/drain extension region 110 below the offset spacer 118; a source/drain contact region 128 in the substrate 100 besides the spacer 120 and the gate structure 106; an offset oxide layer 154 covering the source/drain extension region 110, the offset oxide layer 154 having a bottom surface 154b below a bottom surface 102b of the gate dielectric layer 102; and an offset oxide layer 144 covering the substrate 100 and the source/drain contact region 128. The bottom surface 144b of the offset oxide layer 144 on the source/drain contact region 128 is different from that of the offset oxide layer 144 on the source/drain extension region 110. The offset oxide layer 144 having a bottom surface 144b below a bottom surface 154b of the offset oxide layer 154.

Because a uniform offset oxide layers is formed on the substrate by performing the oxidation process, the depth of the source/drain extension region and that of the source/drain contact region are uniform so that the effective channel length will not be affected and the uniformity and performance of the device will be enhanced.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method for fabricating a semiconductor device, comprising:
providing a substrate;
forming a gate dielectric layer and a gate conductive layer on the dielectric layer;
patterning the gate conductive layer;
performing a first oxidation process to form a first offset oxide layer in the substrate not covering by the gate electrode;
forming a source/drain extension region in the substrate below the first offset oxide layer;
forming a spacer on a sidewall of the gate electrode;
performing a second oxidation process to form a second offset oxide layer; and
forming a source/drain contact region in the substrate at two sides of the gate electrode and the spacer,
wherein the step of forming the source/drain extension region is performed after performing the first oxidation process and before forming the spacer, and the step of performing the second oxidation process is performed after forming the spacer and before forming the source/drain contact region.

2. The method of claim 1 further comprising removing a portion of the gate dielectric layer.

3. The method of claim 2, wherein the step of removing the portion of the gate dielectric layer is performed using the gate electrode as mask after the step of forming the source/drain extension region and before the step of forming the spacer.

4. The method of claim 2, wherein the step of removing the gate dielectric layer is performed using the gate electrode and the spacer as a mask before the step of forming the source/drain contact region and after the step of forming the spacer.

5. The method of claim 4, wherein the second oxidation process comprises an oxygen plasma treatment process, a thermal oxidation process or a RTA oxidation process.

6. The method of claim 5 further comprising a step of removing the first offset oxide layer after the step of the forming the spacer and before the second oxidation process.

7. The method of claim 2, wherein the step of removing the gate dielectric layer is performed before the step of performing the first oxidation process and after the step of patterning the gate conductive layer.

8. The method of claim 7 further comprising a step of removing the first offset oxide layer before the step of the forming the spacer.

9. The method of claim 1 further comprising a step of removing the first offset oxide layer before the step of forming the spacer.

10. The method of claim 1, wherein the second oxidation process comprises an oxygen plasma treatment process, a thermal oxidation process or a RTA oxidation process.

11. The method of claim 1 further comprising a step of removing the first offset oxide layer after the step of forming the spacer and before the step of performing the second oxidation process.

12. The method of claim 1 further comprises removing portion of the gate dielectric layer and the first offset oxide layer before the step of forming the source/drain contact region.

13. The method of claim 1, wherein the first oxidation process comprises an oxygen plasma treatment process, a thermal oxidation process or a RTA oxidation process.

14. The method of claim 1 further comprising a step of forming an offset spacer between the sidewall of the gate electrode and the spacer.

15. The method of claim 14, wherein a material of the offset spacer includes silicon oxide.

16. The method of claim 14, wherein a material of the spacer includes silicon nitride.

17. The method of claim 14, wherein a width of the offset spacer is not larger than a width of the spacer.

18. A method for fabricating a semiconductor device, comprising:
providing a substrate;
forming a gate structure on the substrate, the gate structure including a gate dielectric layer on the substrate and a gate conductive layer on the gate dielectric layer;
forming an offset spacer and a spacer on a sidewall of the gate structure;
after forming the offset spacer and the spacer, performing an oxidation process to form an offset oxide layer on a surface exposed by the gate structure, the offset spacer and the spacer; and
forming a source/drain contact region below the offset oxide layer on the substrate at two sides of the gate structure.

19. The method of claim 18 further comprising forming a source/drain extension region in the substrate at two sides of the gate structure before the step of forming the offset spacer and the spacer.

20. The method of claim 18, wherein the oxidation process comprises an oxygen plasma treatment process.

21. The method of claim 18, wherein a material of the offset spacer includes silicon oxide.

22. The method of claim 18, wherein a material of the spacer includes silicon nitride.

23. The method of claim 18, wherein a width of the offset spacer is not larger than a width of the spacer.

* * * * *